(12) United States Patent
Na

(10) Patent No.: US 11,393,399 B2
(45) Date of Patent: Jul. 19, 2022

(54) PIXEL CIRCUIT AND DISPLAY DEVICE INCLUDING THE SAME

(71) Applicant: Samsung Display Co., Ltd., Yongin-si (KR)

(72) Inventor: Jisu Na, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/321,144

(22) Filed: May 14, 2021

(65) Prior Publication Data

US 2021/0366397 A1 Nov. 25, 2021

(30) Foreign Application Priority Data

May 20, 2020 (KR) .......................... 10-2020-0060287

(51) Int. Cl.
*G09G 3/3258* (2016.01)
*G09G 3/3291* (2016.01)
*H01L 27/32* (2006.01)

(52) U.S. Cl.
CPC ......... *G09G 3/3258* (2013.01); *G09G 3/3291* (2013.01); *H01L 27/3262* (2013.01); *H01L 27/3265* (2013.01)

(58) Field of Classification Search
CPC ..... G09G 2300/0809; G09G 2320/045; G09G 2320/043; G09G 3/3266; G09G 2310/0262; G09G 2300/0426; G09G 2310/06; G09G 2310/0267
See application file for complete search history.

(56) References Cited

U.S. PATENT DOCUMENTS

| | | | | |
|---|---|---|---|---|
| 2002/0044625 A1* | 4/2002 | Kim | ...................... | G11C 19/184 377/54 |
| 2007/0001941 A1* | 1/2007 | Umezaki | .............. | G09G 3/3283 345/77 |
| 2008/0211397 A1* | 9/2008 | Choi | .................... | G09G 3/3233 313/504 |
| 2009/0315815 A1* | 12/2009 | Woo | ..................... | G09G 3/3233 345/82 |
| 2010/0207968 A1* | 8/2010 | Kim | ..................... | G09G 3/3266 345/691 |
| 2015/0243215 A1* | 8/2015 | Kim | ..................... | G09G 3/3233 345/77 |

FOREIGN PATENT DOCUMENTS

KR   10-2018-0099020 A   9/2018

* cited by examiner

*Primary Examiner* — Shaheda A Abdin
(74) *Attorney, Agent, or Firm* — Lewis Roca Rothgerber Christie LLP

(57) ABSTRACT

A pixel circuit includes a first transistor, a second transistor operating based on a gate control signal, a third transistor operating based on a compensation control signal, a fourth transistor operating based on a previous gate control signal, fifth and sixth transistors operating based on an emission control signal, a seventh transistor operating based on a bias control signal, an eighth transistor operating based on the bias control signal, a storage capacitor, and a light emitting element connected to the first transistor. The pixel circuit performs one display-scan operation when a driving time of a panel driving frame is a minimum driving time and performs one display-scan operation and at least one self-scan operation when the driving time is not the minimum driving time.

20 Claims, 9 Drawing Sheets

PIXEL CIRCUIT AND DISPLAY DEVICE INCLUDING THE SAME

CROSS-REFERENCE TO RELATED APPLICATION

The present application claims priority to and the benefit of Korean Patent Application No. 10-2020-0060287 filed on May 20, 2020 in the Korean Intellectual Property Office (KIPO), the entire contents of which are hereby incorporated herein by reference.

BACKGROUND

1. Field

Aspects of some embodiments according to the present disclosure relate generally to a display device.

2. Description of the Related Art

Generally, a display device includes a source device and a sink device. Here, the source device (e.g., a graphic processing unit (GPU)) transmits image data to the sink device, and the sink device performs a displaying operation based on the image data received from the source device. According to characteristics of an image displayed, the display device may change a frame rate (or a driving time) of an image frame while the sink device performs the displaying operation. However, if a frame rate (or a driving time) of a panel driving frame for the displaying operation is not changed according to the frame rate, the frame rate of the image frame (e.g., a GPU rendering speed) may become inconsistent with the frame rate of the panel driving frame, which may causing a tearing phenomenon (e.g., the image is cut off), a stuttering phenomenon (e.g., the image is delayed), and the like on the image that the sink device displays. In order to address such problems, a sync technology may be adopted to change the frame rate of the panel driving frame by increasing or decreasing a vertical blank period of the panel driving frame according to the varying frame rate of the image frame. However, because the driving time of the panel driving frame may be increased when the frame rate of the panel driving frame is decreased, characteristics of a driving transistor included in a pixel circuit of the display panel may be fixed in a specific state during the panel driving frame, which may cause a flicker effect on the display panel due to hysteresis characteristics. In addition, when the number of control signals that are applied to the pixel circuit to reduce the flicker is increased and when at least one driver that provides the control signals (e.g., a compensation control signal and the like) is located at one side of the display panel, luminance non-uniformity may occur between a region near the driver and a region far from the driver on the display panel. Thus, a display panel that operates at a relatively low driving frequency by adopting the sync technology may exhibit a relatively degraded quality of the image displayed on the display panel.

The above information disclosed in this Background section is only for enhancement of understanding of the background and therefore the information discussed in this Background section does not necessarily constitute prior art.

SUMMARY

Aspects of some embodiments according to the present disclosure relate generally to a display device. For example, some embodiments of the present disclosure relate to a display device (e.g., an organic light emitting display device) that is capable of changing a driving frequency of a display panel (i.e. a driving time of a panel driving frame) and a pixel circuit included therein.

Aspects of some embodiments include a pixel circuit that can prevent or reduce a flicker phenomenon in a display panel due to hysteresis characteristics as characteristics of a driving transistor are fixed in a specific state during a panel driving frame by performing one display-scan operation, which is an operation that receives a data signal to emit light using a light emitting element, when a driving time (or referred to as a driving time duration) of the panel driving frame is a minimum driving time (or referred to as a minimum driving time duration) and by performing one display-scan operation and at least one self-scan operation, which is an operation that changes characteristics of the driving transistor, when the driving time of the panel driving frame is not the minimum driving time and that can prevent a phenomenon that luminance non-uniformity occurs on the display panel by performing an initializing operation, which is an operation that initializes a gate terminal of the driving transistor, without receiving an initialization control signal (i.e., by having a structure that can make a compensation control signal be provided from both sides of the display panel).

Some embodiments include a display device (e.g., an organic light emitting display device and the like) including the pixel circuit that can provide a high quality image to a viewer (or user) even when a display panel operates at a relatively low driving frequency.

According to some embodiments according to the present disclosure, a pixel circuit may include a first transistor including a first terminal connected to a first node, a gate terminal connected to a second node, and a second terminal connected to a third node, a second transistor including a first terminal that receives a data signal, a second terminal connected to the first node, and a gate terminal that receives a gate control signal, a third transistor including a first terminal connected to the third node, a second terminal connected to the second node, and a gate terminal that receives a compensation control signal, a fourth transistor including a first terminal connected to the third node, a second terminal that receives a first initialization voltage, and a gate terminal that receives a previous gate control signal that is applied before the gate control signal, a fifth transistor including a first terminal that receives a first power voltage, a second terminal connected to the first node, and a gate terminal that receives an emission control signal, a sixth transistor including a first terminal connected to the third node, a second terminal connected to a fourth node, and a gate terminal that receives the emission control signal, a seventh transistor including a first terminal connected to the fourth node, a second terminal that receives a second initialization voltage, and a gate terminal that receives a bias control signal, an eighth transistor including a first terminal connected to the first node, a second terminal that receives a bias voltage, and a gate terminal that receives the bias control signal, a storage capacitor including a first terminal that receives the first power voltage and a second terminal connected to the second node, and a light emitting element including a first terminal connected to the fourth node and a second terminal that receives a second power voltage lower than the first power voltage. Here, the pixel circuit may perform one display-scan operation when a driving time of a panel driving frame is a minimum driving time and may perform one display-scan operation and at least one self-scan operation when the driving time of the panel driving frame is not the minimum driving time.

According to some embodiments, the third transistor may be implemented by an oxide thin film transistor.

According to some embodiments, the third transistor may be an n-channel metal oxide semiconductor (NMOS) transistor.

According to some embodiments, when the display-scan operation is performed, each of the gate control signal, the previous gate control signal, the compensation control signal, the bias control signal, and the emission control signal may include a turn-on voltage period.

According to some embodiments, the turn-on voltage period of the gate control signal, the turn-on voltage period of the previous gate control signal, the turn-on voltage period of the compensation control signal, and the turn-on voltage period of the bias control signal may be positioned in a turn-off voltage period of the emission control signal.

According to some embodiments, the turn-on voltage period of the bias control signal may be positioned before the turn-on voltage period of the compensation control signal.

According to some embodiments, the turn-on voltage period of the previous gate control signal and the turn-on voltage period of the gate control signal may be sequentially positioned in the turn-on voltage period of the compensation control signal.

According to some embodiments, when the self-scan operation is performed, each of the bias control signal and the emission control signal may include a turn-on voltage period, and each of the gate control signal, the previous gate control signal, and the compensation control signal may not include the turn-on voltage period.

According to some embodiments, the turn-on voltage period of the bias control signal may be positioned in a turn-off voltage period of the emission control signal.

According to some embodiments of the present disclosure, a pixel circuit may include a first transistor including a first terminal connected to a first node, a gate terminal connected to a second node, and a second terminal connected to a third node, a second transistor including a first terminal that receives a data signal, a second terminal connected to the first node, and a gate terminal that receives a gate control signal, a third transistor including a first terminal connected to the third node, a second terminal connected to the second node, and a gate terminal that receives a compensation control signal, a fourth transistor including a first terminal connected to the third node, a second terminal that receives a first initialization voltage, and a gate terminal that receives a bias control signal, a fifth transistor including a first terminal that receives a first power voltage, a second terminal connected to the first node, and a gate terminal that receives an emission control signal, a sixth transistor including a first terminal connected to the third node, a second terminal connected to a fourth node, and a gate terminal that receives the emission control signal, a seventh transistor including a first terminal connected to the fourth node, a second terminal that receives a second initialization voltage, and a gate terminal that receives the bias control signal, an eighth transistor including a first terminal connected to the first node, a second terminal that receives a bias voltage, and a gate terminal that receives the bias control signal, a storage capacitor including a first terminal that receives the first power voltage and a second terminal connected to the second node, and a light emitting element including a first terminal connected to the fourth node and a second terminal that receives a second power voltage lower than the first power voltage. Here, the pixel circuit may perform one display-scan operation when a driving time of a panel driving frame is a minimum driving time and may perform one display-scan operation and at least one self-scan operation when the driving time of the panel driving frame is not the minimum driving time.

According to some embodiments, the third transistor may be implemented by an oxide thin film transistor.

According to some embodiments, the third transistor may be an n-channel metal oxide semiconductor (NMOS) transistor.

According to some embodiments, when the display-scan operation is performed, each of the gate control signal, the compensation control signal, the bias control signal, and the emission control signal may include a turn-on voltage period.

According to some embodiments, the turn-on voltage period of the gate control signal, the turn-on voltage period of the compensation control signal, and the turn-on voltage period of the bias control signal may be positioned in a turn-off voltage period of the emission control signal.

According to some embodiments, the turn-on voltage period of the bias control signal and the turn-on voltage period of the gate control signal may be sequentially positioned in the turn-on voltage period of the compensation control signal.

According to some embodiments, when the self-scan operation is performed, each of the bias control signal and the emission control signal may include a turn-on voltage period, and each of the gate control signal and the compensation control signal may not include the turn-on voltage period.

According to some embodiments, the turn-on voltage period of the bias control signal may be positioned in a turn-off voltage period of the emission control signal.

According to some embodiments of the present disclosure, a display device may include a display panel including a pixel circuit configured to perform an initializing operation, which is an operation that initializes a gate terminal of a driving transistor, without receiving an initialization control signal, first and second gate drivers configured to apply a gate control signal to the pixel circuit via gate lines extending in a first direction and located at opposite sides of the display panel in the first direction, first and second compensation drivers configured to apply a compensation control signal to the pixel circuit via compensation lines extending in the first direction and located at opposite sides of the display panel in the first direction, a bias driver configured to apply a bias control signal to the pixel circuit via bias lines extending in the first direction and located at one side of the display panel in the first direction, an emission driver configured to apply an emission control signal to the pixel circuit via emission lines extending in the first direction and located at one side of the display panel in the first direction, a data driver configured to apply a data signal to the pixel circuit via data lines extending in a second direction crossing the first direction, and a timing controller configured to control the first and second gate drivers, the first and second compensation drivers, the bias driver, the emission driver, and the data driver.

According to some embodiments, the pixel circuit may include a first transistor including a first terminal connected to a first node, a gate terminal connected to a second node, and a second terminal connected to a third node, the first transistor being the driving transistor, a second transistor including a first terminal that receives the data signal, a second terminal connected to the first node, and a gate terminal that receives the gate control signal, a third transistor including a first terminal connected to the third node, a second terminal connected to the second node, and a gate terminal that receives the compensation control signal, a fourth transistor including a first terminal connected to the third node, a second terminal that receives a first initialization voltage, and a gate terminal that receives a previous gate control signal that is applied before the gate control signal, a fifth transistor including a first terminal that receives a first power voltage, a second terminal connected to the first node, and a gate terminal that receives the emission control signal, a sixth transistor including a first terminal connected to the third node, a second terminal connected to a fourth node, and a gate terminal that receives the emission control signal, a seventh transistor including a first terminal connected to the fourth node, a second terminal that receives a second initialization voltage, and a gate terminal that receives the bias control signal, an eighth transistor including a first terminal connected to the first node, a second terminal that receives a bias voltage, and a gate terminal that receives the bias control signal, a storage capacitor including a first terminal that receives the first power voltage and a second terminal connected to the second node, and a light emitting element including a first terminal connected to the fourth node and a second terminal that receives a second power voltage lower than the first power voltage. Here, the pixel circuit may perform one display-scan operation when a driving time of a panel driving frame is a minimum driving time and may perform one display-scan operation and at least one self-scan operation when the driving time of the panel driving frame is not the minimum driving time.

According to some embodiments, the pixel circuit may include a first transistor including a first terminal connected to a first node, a gate terminal connected to a second node, and a second terminal connected to a third node, the first transistor being the driving transistor, a second transistor including a first terminal that receives the data signal, a second terminal connected to the first node, and a gate terminal that receives the gate control signal, a third transistor including a first terminal connected to the third node, a second terminal connected to the second node, and a gate terminal that receives the compensation control signal, a fourth transistor including a first terminal connected to the third node, a second terminal that receives a first initialization voltage, and a gate terminal that receives the bias control signal, a fifth transistor including a first terminal that receives a first power voltage, a second terminal connected to the first node, and a gate terminal that receives the emission control signal, a sixth transistor including a first terminal connected to the third node, a second terminal connected to a fourth node, and a gate terminal that receives the emission control signal, a seventh transistor including a first terminal connected to the fourth node, a second terminal that receives a second initialization voltage, and a gate terminal that receives the bias control signal, an eighth transistor including a first terminal connected to the first node, a second terminal that receives a bias voltage, and a gate terminal that receives the bias control signal, a storage capacitor including a first terminal that receives the first power voltage and a second terminal connected to the second node, and a light emitting element including a first terminal connected to the fourth node and a second terminal that receives a second power voltage lower than the first power voltage. Here, the pixel circuit may perform one display-scan operation when a driving time of a panel driving frame is a minimum driving time and may perform one display-scan operation and at least one self-scan operation when the driving time of the panel driving frame is not the minimum driving time.

Therefore, a pixel circuit according to some embodiments may prevent or reduce a flicker phenomenon in a display panel due to hysteresis characteristics as characteristics of a driving transistor are fixed in a specific state during a panel driving frame by including a first transistor including a first terminal connected to a first node, a gate terminal connected to a second node, and a second terminal connected to a third node, a second transistor including a first terminal that receives a data signal, a second terminal connected to the first node, and a gate terminal that receives a gate control signal, a third transistor including a first terminal connected to the third node, a second terminal connected to the second node, and a gate terminal that receives a compensation control signal, a fourth transistor including a first terminal connected to the third node, a second terminal that receives a first initialization voltage, and a gate terminal that receives a bias control signal or a previous gate control signal that is applied before the gate control signal, a fifth transistor including a first terminal that receives a first power voltage, a second terminal connected to the first node, and a gate terminal that receives an emission control signal, a sixth transistor including a first terminal connected to the third node, a second terminal connected to a fourth node, and a gate terminal that receives the emission control signal, a seventh transistor including a first terminal connected to the fourth node, a second terminal that receives a second initialization voltage, and a gate terminal that receives a bias control signal, an eighth transistor including a first terminal connected to the first node, a second terminal that receives a bias voltage, and a gate terminal that receives the bias control signal, a storage capacitor including a first terminal that receives the first power voltage and a second terminal connected to the second node, and a light emitting element including a first terminal connected to the fourth node and a second terminal that receives a second power voltage lower than the first power voltage, by performing one display-scan operation, which is an operation that receives the data signal to emit light using the light emitting element, when a driving time of the panel driving frame is a minimum driving time, and by performing one display-scan operation and at least one self-scan operation, which is an operation that changes characteristics of the driving transistor, when the driving time of the panel driving frame is not the minimum driving time. In addition, the pixel circuit may prevent a phenomenon that luminance non-uniformity occurs due to deviations of a falling time and/or a rising time of the compensation control signal according to a location of the pixel circuit in the display panel by performing an initializing operation, which is an operation that initializes the gate terminal of the driving transistor, without receiving an initialization control signal (i.e., because a related art initialization driver that provides the initialization control signal may not be located at one side of the display panel, an additional compensation driver that provides the compensation control signal can be located at a space where the related art initialization driver may be located, and thus the compensation control signal can be provided from both sides of the display panel).

In addition, a display device including the pixel circuit according to some embodiments may provide a high quality image to a viewer (or user) even when a display panel operates at a low driving frequency.

BRIEF DESCRIPTION OF THE DRAWINGS

Illustrative, non-limiting embodiments will be more clearly understood from the following detailed description in conjunction with the accompanying drawings.

DETAILED DESCRIPTION

Hereinafter, aspects of some embodiments of the present disclosure will be explained in more detail with reference to the accompanying drawings.

Figure 1:
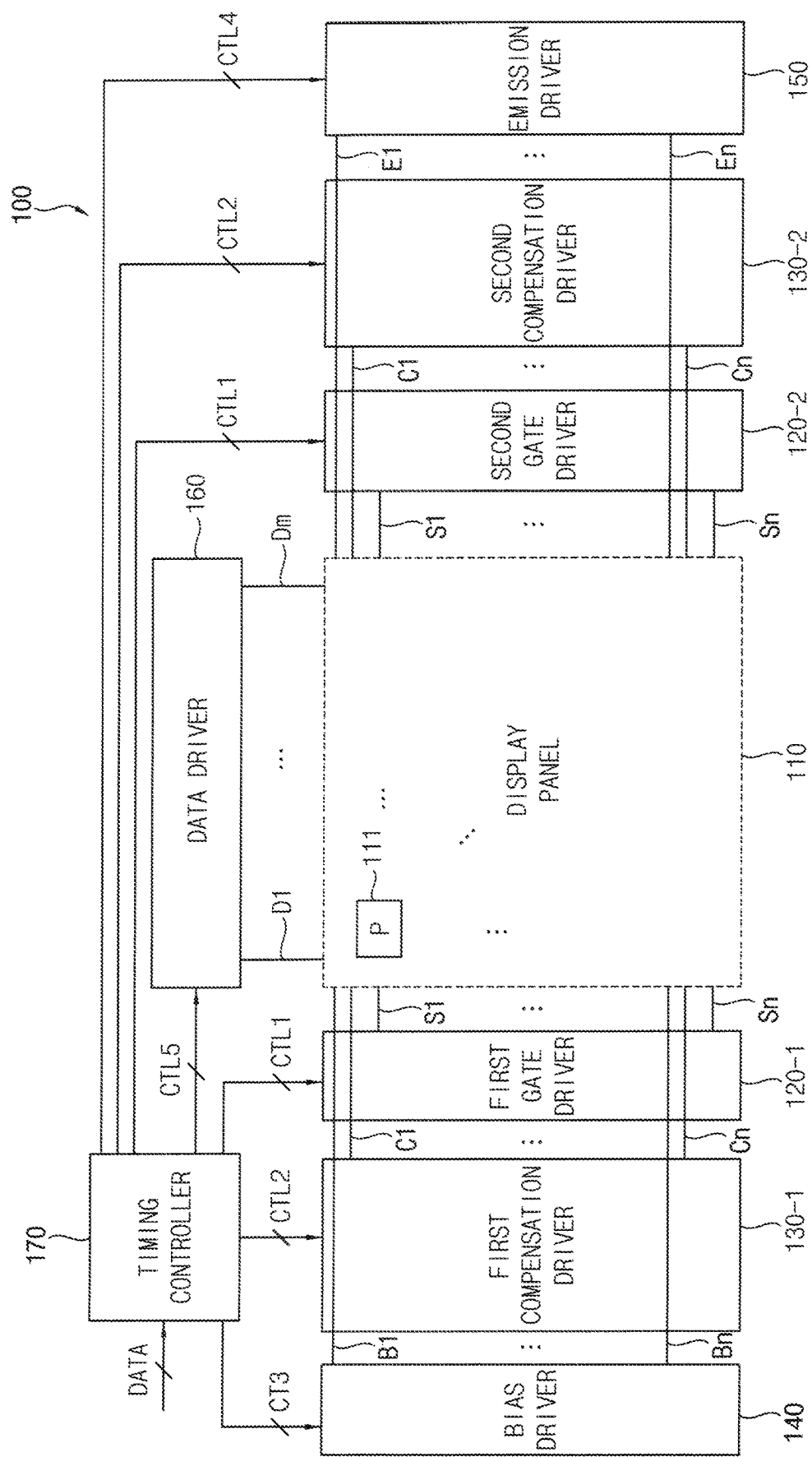
FIG. 1 is a block diagram illustrating a display device according to some embodiments.
Figure 2:
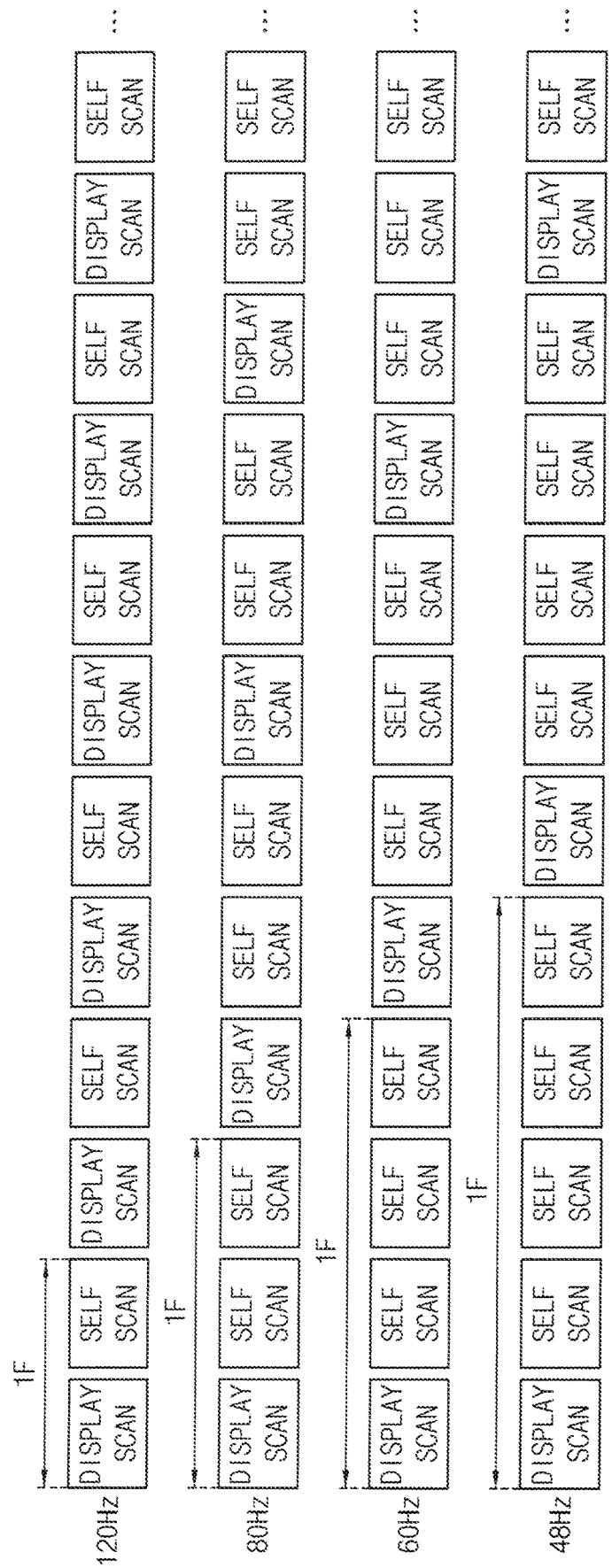
FIG. 2 is a concept diagram for describing that the display device of FIG. 1 operates according to some embodiments.
Figure 3:
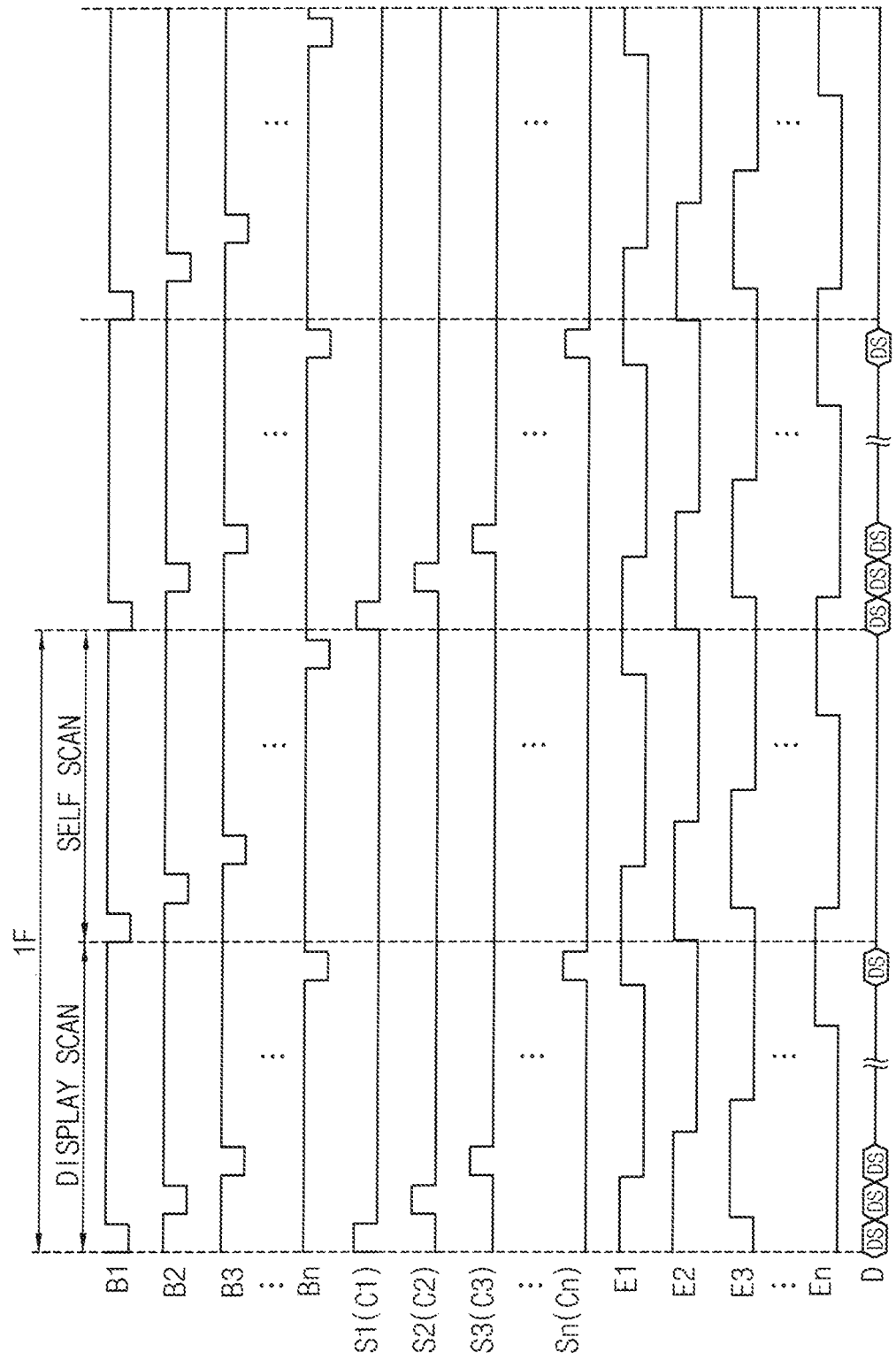
FIG. 3 is a timing diagram illustrating an example in which the display device of FIG. 1 operates at a first driving frequency according to some embodiments.
Figure 4:
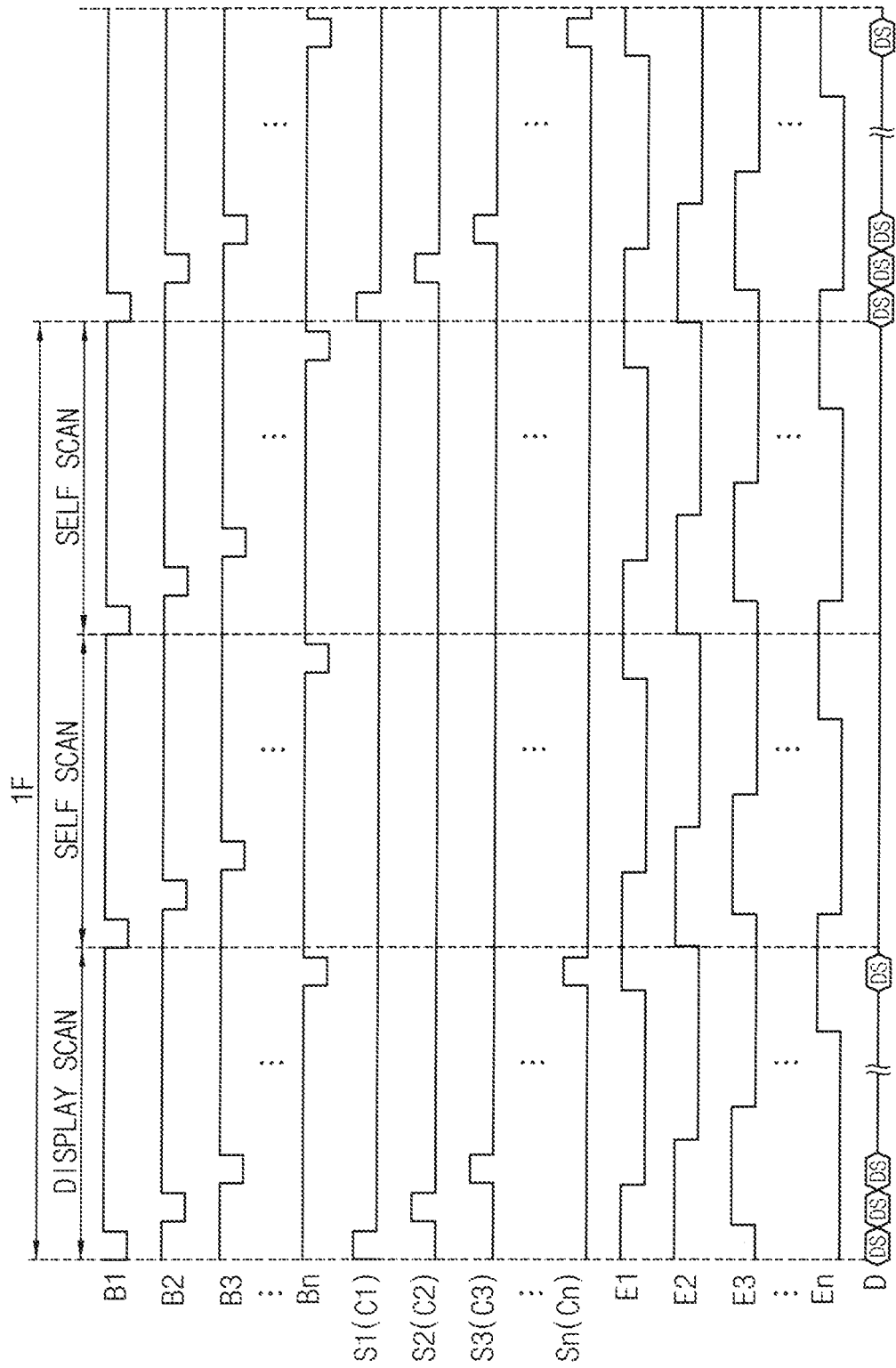
FIG. 4 is a timing diagram illustrating an example in which the display device of FIG. 1 operates at a second driving frequency according to some embodiments.

FIG. 1 is a block diagram illustrating a display device according to some embodiments, FIG. 2 is a concept diagram for describing that the display device of FIG. 1 operates, FIG. 3 is a timing diagram illustrating an example in which the display device of FIG. 1 operates at a first driving frequency, and FIG. 4 is a timing diagram illustrating an example in which the display device of FIG. 1 operates at a second driving frequency.

Referring to FIGS. 1 to 4, the display device 100 may include a display panel 110, a first scan driver 120-1, a second scan driver 120-2, a first compensation driver 130-1, a second compensation driver 130-2, a bias driver 140, an emission driver 150, a data driver 160, and a timing controller 170. Here, the display device 100 may display an image at various driving frequencies according to driving conditions. For example, the display device 100 may display the image at a driving frequency between 1 Hz and 120 Hz (i.e., a frame rate of a panel driving frame may be between 1 Hz and 120 Hz). Here, the display device 100 may be an organic light emitting display device or a quantum-dot light emitting display device. However, the display device 100 is not limited thereto.

The display panel 110 may include a plurality of pixel circuits 111. For example, the pixel circuits 111 may include a red displaying pixel circuit, a green displaying pixel circuit, and a blue displaying pixel circuit. Here, each of the pixel circuits 111 may be connected to a gate line Sj that transfers a gate control signal, where j is an integer between 1 and n, a compensation line Cj that transfers a compensation control signal, a bias line Bj that transfers a bias control signal, and an emission line Ej that transfers an emission control signal. According to some embodiments, each of the pixel circuits 111 may perform one display-scan operation, which is an operation that receives a data signal to emit light using a light emitting element, when a driving time of a panel driving frame is a minimum driving time. In addition, each of the pixel circuits 111 may perform one display-scan operation and at least one self-scan operation, which is an operation that changes characteristics of a driving transistor, when the driving time of the panel driving frame is not the minimum driving time. Further, each of the pixel circuits 111 may perform an initializing operation, which is an operation that initializes a gate terminal of the driving transistor, without receiving an initialization control signal. For this operation, each of the pixel circuits 111 may have an 8T-1C structure that includes eight transistors and one capacitor. As illustrated in FIG. 1, the first and second gate drivers 120-1 and 120-2 may be located at both (e.g., opposite) sides of the display panel 110, the first and second compensation drivers 130-1 and 130-2 may be located at both (e.g., opposite) sides of the display panel 110, the bias driver 140 may be located at one side of the display panel 110 (e.g., at a left side of the display panel 110 in FIG. 1), and the emission driver 150 may be located at one (e.g., another) side of the display panel 110 (e.g., at a right side of the display panel 110 in FIG. 1).

According to some embodiments, each of the pixel circuits 111 may include a first transistor (e.g., referred to as a driving transistor) including a first terminal connected to a first node, a gate terminal connected to a second node, and a second terminal connected to a third node, a second transistor (e.g., referred to as a switching transistor) including a first terminal that receives the data signal, a second terminal connected to the first node, and a gate terminal that receives the gate control signal, a third transistor (e.g., referred to as a compensation transistor) including a first terminal connected to the third node, a second terminal connected to the second node, and a gate terminal that receives the compensation control signal, a fourth transistor (e.g., referred to as an initialization transistor) including a first terminal connected to the third node, a second terminal that receives a first initialization voltage, and a gate terminal that receives a previous gate control signal that is applied before the gate control signal, a fifth transistor (e.g., referred to as a first emission transistor) including a first terminal that receives a first power voltage, a second terminal connected to the first node, and a gate terminal that receives the emission control signal, a sixth transistor (e.g., referred to as a second emission transistor) including a first terminal connected to the third node, a second terminal connected to a fourth node, and a gate terminal that receives the emission control signal, a seventh transistor (e.g., referred to as a reset transistor) including a first terminal connected to the fourth node, a second terminal that receives a second initialization voltage, and a gate terminal that receives the bias control signal, an eighth transistor (e.g., referred to as a self-scan transistor) including a first terminal connected to the first node, a second terminal that receives a bias voltage, and a gate terminal that receives the bias control signal, a storage capacitor including a first terminal that receives the first power voltage and a second terminal connected to the second node, and a light emitting element including a first terminal connected to the fourth node and a second terminal that receives a second power voltage lower than the first power voltage. Such embodiments will be described in more detail with reference to FIGS. 5 to 7.

According to some embodiments, each of the pixel circuits 111 may include a first transistor (e.g., referred to as the driving transistor) including a first terminal connected to a first node, a gate terminal connected to a second node, and a second terminal connected to a third node, a second transistor (e.g., referred to as the switching transistor) including a first terminal that receives the data signal, a second terminal connected to the first node, and a gate terminal that receives the gate control signal, a third transistor (e.g., referred to as the compensation transistor) including a first terminal connected to the third node, a second terminal connected to the second node, and a gate terminal that receives the compensation control signal, a fourth transistor (e.g., referred to as the initialization transistor) including a first terminal connected to the third node, a second terminal that receives the first initialization voltage, and a gate terminal that receives the bias control signal, a fifth transistor (e.g., referred to as the first emission transistor) including a first terminal that receives the first power voltage, a second terminal connected to the first node, and a gate terminal that receives the emission control signal, a sixth transistor (e.g., referred to as the second emission transistor) including a first terminal connected to the third node, a second terminal connected to a fourth node, and a gate terminal that receives the emission control signal, a seventh transistor (e.g., referred to as the reset transistor) including a first terminal connected to the fourth node, a second terminal that receives the second initialization voltage, and a gate terminal that receives the bias control signal, an eighth transistor (e.g., referred to as the self-scan transistor) including a first terminal connected to the first node, a second terminal that receives the bias voltage, and a gate terminal that receives the bias control signal, a storage capacitor including a first terminal that receives the first power voltage and a second terminal connected to the second node, and a light emitting element including a first terminal connected to the fourth node and a second terminal that receives the second power voltage lower than the first power voltage. Such embodiments will be described in more detail with reference to FIGS. 8 to 10.

The first and second gate drivers 120-1 and 120-2 may be connected to the display panel 110 via gate lines S1 through Sn extending in a first direction. Thus, the first and second gate drivers 120-1 and 120-2 may apply the gate control signal to the display panel 110 via the gate lines S1 through Sn extending in the first direction. For example, as illustrated in FIGS. 3 and 4, the first and second gate drivers 120-1 and 120-2 may apply the gate control signal having a turn-on voltage period and a turn-off voltage period to the display panel 110 in a display-scan period DISPLAY SCAN in which the pixel circuits 111 perform a display-scan operation and may apply the gate control signal having only a turn-off voltage period to the display panel 110 in a self-scan period SELF SCAN in which the pixel circuits 111 perform a self-scan operation. Here, because the first and second gate drivers 120-1 and 120-2 are located at both sides of the display panel 110 in the first direction and the first and second gate drivers 120-1 and 120-2 apply the gate control signal at both sides of the display panel 110 in the first direction, deviations of a falling time and/or a rising time of the gate control signal according to a location of the pixel circuit 111 in the display panel 110 may not be caused. For example, if a gate driver is located only at one side of the display panel 110 and the gate driver applies the gate control signal at one side of the display panel 110, deviations of the falling time and/or the rising time of the gate control signal according to the location of the pixel circuit 111 in the display panel 110 may be caused, and thus luminance non-uniformity may occur between a region near the gate driver and a region far from the gate driver on the display panel 110. Thus, the display device 100 may include the first and second gate drivers 120-1 and 120-2 located at both sides of the display panel 110 in the first direction and thus may prevent a phenomenon that luminance non-uniformity due to deviations of the falling time and/or the rising time of the gate control signal according to the location of the pixel circuit 111 in the display panel 110 occurs.

The first and second compensation drivers 130-1 and 130-2 may be connected to the display panel 110 via compensation lines C1 through Cn extending in the first direction. Thus, the first and second compensation drivers 130-1 and 130-2 may apply the compensation control signal to the display panel 110 via the compensation lines C1 through Cn extending in the first direction. For example, as illustrated in FIGS. 3 and 4, the first and second compensation drivers 130-1 and 130-2 may apply the compensation control signal having a turn-on voltage period and a turn-off voltage period to the display panel 110 in the display-scan period DISPLAY SCAN in which the pixel circuits 111 perform the display-scan operation and may apply the compensation control signal having only a turn-off voltage period to the display panel 110 in the self-scan period SELF SCAN in which the pixel circuits 111 perform the self-scan operation. Here, because the first and second compensation drivers 130-1 and 130-2 are located at both sides of the display panel 110 in the first direction and the first and second compensation drivers 130-1 and 130-2 apply the compensation control signal at both sides of the display panel 110 in the first direction, deviations of a falling time and/or a rising time of the compensation control signal according to the location of the pixel circuit 111 in the display panel 110 may not be caused. For example, if a compensation driver is located only at one side of the display panel 110 and the gate driver applies the compensation control signal at one side of the display panel 110, deviations of the falling time and/or the rising time of the compensation control signal according to the location of the pixel circuit 111 in the display panel 110 may be caused, and thus luminance non-uniformity may occur between a region near the compensation driver and a region far from the compensation driver on the display panel 110.

Thus, according to some embodiments, the display device 100 may include the first and second compensation drivers 130-1 and 130-2 located at both (e.g., opposite) sides of the display panel 110 in the first direction, and thus may prevent a phenomenon in which luminance non-uniformity due to deviations of the falling time and/or the rising time of the compensation control signal according to the location of the pixel circuit 111 in the display panel 110 occurs. In other words, because the pixel circuit 111 performs the initializing operation (i.e., the operation that initializes the gate terminal of the driving transistor) without receiving the initialization control signal, a related art initialization driver that provides the initialization control signal is not located at one side of the display panel 110, and thus an additional compensation driver that provides the compensation control signal is located at a space where the related art initialization driver may be located in a related art display device.

The bias driver 140 may be connected to the display panel 110 via bias lines B1 through Bn extending in the first direction. Thus, the bias driver 140 may apply the bias control signal to the display panel 110 via the bias lines B1 through Bn extending in the first direction. For example, as illustrated in FIGS. 3 and 4, the bias driver 140 may apply the bias control signal having a turn-on voltage period and a turn-off voltage period to the display panel 110 in the display-scan period DISPLAY SCAN in which the pixel circuits 111 perform the display-scan operation and may apply the bias control signal having a turn-on voltage period and a turn-off voltage period to the display panel 110 in the self-scan period SELF SCAN in which the pixel circuits 111 perform the self-scan operation. Here, the bias driver 140 may be located at one side of the display panel 110 (e.g., at a left side of the display panel 110 in FIG. 1) in the first direction. The emission driver 150 may be connected to the display panel 110 via emission lines E1 through En extending in the first direction.

Thus, according to some embodiments, the emission driver 150 may apply the emission control signal to the display panel 110 via the emission lines E1 through En extending in the first direction. For example, as illustrated in FIGS. 3 and 4, the emission driver 150 may apply the emission control signal having a turn-on voltage period and a turn-off voltage period to the display panel 110 in the display-scan period DISPLAY SCAN in which the pixel circuits 111 perform the display-scan operation and may apply the emission control signal having a turn-on voltage period and a turn-off voltage period to the display panel 110 in the self-scan period SELF SCAN in which the pixel circuits 111 perform the self-scan operation. Here, the emission driver 150 may be located at one side of the display panel 110 (e.g., at a right side of the display panel 110 in FIG. 1) in the first direction. Generally, the falling time and/or the rising time of the gate control signal applied to the gate terminal of the switching transistor in the pixel circuit 111 and the falling time and/or the rising time of the compensation control signal applied to the gate terminal of the compensation transistor in the pixel circuit 111 may have a relatively large influence on luminance of the pixel circuit 111, but the falling time and/or the rising time of the bias control signal applied to the gate terminal of the reset transistor in the pixel circuit 111 and the falling time and/or the rising time of the emission control signal applied to the gate terminal of the emission transistor in the pixel circuit 111 may have a relatively small influence on luminance of the pixel circuit 111. Therefore, each of the bias driver 140 and the emission driver 150 may be located at one side of the display panel 110 in the display device 100.

The display panel 110 may be connected to the data driver 160 via data lines D1 through Dm extending in a second direction crossing the first direction (e.g., the first direction may be perpendicular to the second direction). The data driver 160 may provide the data signal (or referred to as a data voltage) to the display panel 110 via the data lines D1 through Dm extending in the second direction. For example, as illustrated in FIGS. 3 and 4, the data driver 160 may apply the data signal to the display panel 110 in the display-scan period DISPLAY SCAN in which the pixel circuits 111 perform the display-scan operation (i.e., indicated by DS) and may not apply the data signal to the display panel 110 in the self-scan period SELF SCAN in which the pixel circuits 111 perform the self-scan operation. The timing controller 170 may generate a plurality of control signals CTL1, CTL2, CTL3, CTL4, and CTL5 to control the first gate driver 120-1, the second gate driver 120-2, the first compensation driver 130-1, the second compensation driver 130-2, the bias driver 140, the emission driver 150, and the data driver 160.

The timing controller 170 may receive image data DATA from an external component (e.g., a graphic processing unit (GPU) and the like) using a specific interface and may perform a specific processing (e.g., luminance compensation, deterioration compensation, and the like) on the image data DATA to provide the processed image data DATA to the data driver 160. For example, as illustrated in FIG. 2, the timing controller 170 may perform one display-scan period DISPLAY SCAN and at least one self-scan period SELF SCAN at driving frequencies (i.e., 120 Hz, 80 Hz, 60 Hz, 48 Hz) other than a maximum driving frequency of the display panel 110 (i.e., it is assumed in FIG. 2 that the maximum driving frequency of the display panel 110 is 240 Hz). For example, one panel driving frame 1F may include one display-scan period DISPLAY SCAN and one self-scan period SELF SCAN when the driving frequency of the display panel 110 is 120 Hz, one panel driving frame 1F may include one display-scan period DISPLAY SCAN and two self-scan periods SELF SCAN when the driving frequency of the display panel 110 is 80 Hz, one panel driving frame 1F may include one display-scan period DISPLAY SCAN and three self-scan periods SELF SCAN when the driving frequency of the display panel 110 is 60 Hz, and one panel driving frame 1F may include one display-scan period DISPLAY SCAN and four self-scan periods SELF SCAN when the driving frequency of the display panel 110 is 48 Hz. As described above, the timing controller 170 may respond to a change of the driving frequency of the display panel 110 (i.e., a change of the frame rate of the panel driving frame or a change of the driving time of the panel driving frame) by adjusting the number of the self-scan period SELF SCAN.

For example, as illustrated in FIGS. 3 and 4, in the display-scan period DISPLAY SCAN in which the pixel circuits 111 perform the display-scan operation, the bias control signal applied to the pixel circuits 111 via the bias lines B1 through Bn may include a turn-on voltage period, the gate control signal applied to the pixel circuits 111 via the gate lines S1 through Sn may include a turn-on voltage period, the compensation control signal applied to the pixel circuits 111 via the compensation lines C1 through Cn may include a turn-on voltage period, and the emission control signal applied to the pixel circuits 111 via the emission lines E1 through En may include a turn-on voltage period.

On the other hand, as illustrated in FIGS. 3 and 4, in the self-scan period SELF SCAN in which the pixel circuits 111 perform the self-scan operation, the bias control signal applied to the pixel circuits 111 via the bias lines B1 through Bn may include a turn-on voltage period, the gate control signal applied to the pixel circuits 111 via the gate lines S1 through Sn may not include a turn-on voltage period, the compensation control signal applied to the pixel circuits 111 via the compensation lines C1 through Cn may not include a turn-on voltage period, and the emission control signal applied to the pixel circuits 111 via the emission lines E1 through En may include a turn-on voltage period. In other words, while the bias control signal and the emission control signal includes a turn-on voltage period in both the display-scan period DISPLAY SCAN and the self-scan period SELF SCAN, the gate control signal and the compensation control signal include a turn-on voltage period only in the display-scan period DISPLAY SCAN. Because waveforms in FIGS. 3 and 4 are only illustrated for simplicity in order to indicate whether each of the bias control signal, the gate control signal, the compensation control signal, and the emission control signal has a turn-on voltage period in the display-scan period DISPLAY SCAN and the self-scan period SELF SCAN, it should be understood that a waveform relation among the bias control signal, the gate control signal, the compensation control signal, and the emission control signal is not accurately illustrated. Thus, an accurate waveform relation among the bias control signal, the gate control signal, the compensation control signal, and the emission control signal will be described with reference to FIGS. 5 to 10.

In both the display-scan period DISPLAY SCAN and the self-scan period SELF SCAN, the bias control signal including a turn-on voltage period may be driven at a first frequency that is higher than a driving frequency of the display panel 110 (i.e., the frame rate of the panel driving frame). According to some embodiments, the driving frequency of the display panel 110 may be set to be a factor of the first frequency. For example, the first frequency may be set to be twice or four times the maximum driving frequency of the display panel 110. When the maximum driving frequency of the display panel 110 is 120 Hz, the first frequency may be set to be 240 Hz or 480 Hz. Thus, in one panel driving frame, a scanning operation according to the bias control signal applied to the bias lines B1 through Bn may be repeated several times in a cycle (e.g., a set or predetermined cycle). For example, the bias driver 140 may perform the scanning operation once during the display-scan period DISPLAY SCAN at all driving frequencies of the display panel 110 and may perform the scanning operation at least once during the self-scan period SELF SCAN at driving frequencies other than the maximum driving frequency of the display panel 110 (i.e., no self-scan period SELF SCAN exists at the maximum driving frequency of the display panel 110). In addition, the emission control signal including a turn-on voltage period in both the display-scan period DISPLAY SCAN and the self-scan period SELF SCAN may also be driven at the first frequency that is higher than the driving frequency of the display panel 110 (i.e., the frame rate of the panel driving frame). For example, the first frequency may be set to be twice or four times the maximum driving frequency of the display panel 110. When the maximum driving frequency of the display panel 110 is 120 Hz, the first frequency may be set to be 240 Hz or 480 Hz. Thus, in one panel driving frame, a scanning operation according to the emission control signal applied to the emission lines E1 through En may be repeated several times in a cycle (e.g., a set or predetermined cycle). For example, the emission driver 150 may perform the scanning operation once during the display-scan period DISPLAY SCAN at all driving frequencies of the display panel 110 and may perform the scanning operation at least once during the self-scan period SELF SCAN at driving frequencies other than the maximum driving frequency of the display panel 110 (i.e., no self-scan period SELF SCAN exists at the maximum driving frequency of the display panel 110).

On the other hand, the gate control signal and the compensation control signal including a turn-on voltage period only in the display-scan period DISPLAY SCAN may be driven at a second frequency that is equal to the driving frequency of the display panel 110 (i.e., the frame rate of the panel driving frame). Thus, the second frequency may be set to be a factor of the first frequency. Hence, in one panel driving frame, a scanning operation according to the gate control signal applied to the gate lines S1 through Sn may be performed once. For example, the first and second gate drivers 120-1 and 120-2 may perform the scanning operation once during the display-scan period DISPLAY SCAN at all driving frequencies of the display panel 110 but may not perform the scanning operation during the self-scan period SELF SCAN. Similarly, in one panel driving frame, a scanning operation according to the compensation control signal applied to the compensation lines C1 through Cn may be performed once.

For example, the first and second compensation drivers 130-1 and 130-2 may perform the scanning operation once during the display-scan period DISPLAY SCAN at all driving frequencies of the display panel 110 but may not perform the scanning operation during the self-scan period SELF SCAN. As described above, because the pixel circuits 111 perform the initializing operation (i.e., the operation that initializes the gate terminal of the driving transistor) without receiving the initialization control signal, the display device 100 may not include a related art initialization driver that provides the initialization control signal at one side of the display panel 110. Thus, in the display device 100, the first and second compensation drivers 130-1 and 130-2 that provide the compensation control signal as well as the first and second gate drivers 120-1 and 120-2 that provide the gate control signal may be located at both sides of the display panel 110. Hence, the gate control signal applied to the pixel circuits 111 may be provided from both sides of the display panel 110, the compensation control signal applied to the pixel circuits 111 may be provided from both sides of the display panel 110, and thus deviations of the falling time and/or the rising time of the gate control signal and the compensation control signal according to the location of the pixel circuit 111 in the display panel 110 may be reduced (or minimized). As a result, luminance non-uniformity due to the deviations according to the location of the pixel circuit 111 in the display panel 110 may be prevented or reduced, such that the display device 100 may provide a high quality image to a viewer (or user) even when the display panel 110 operates at a low driving frequency.

Figure 5:
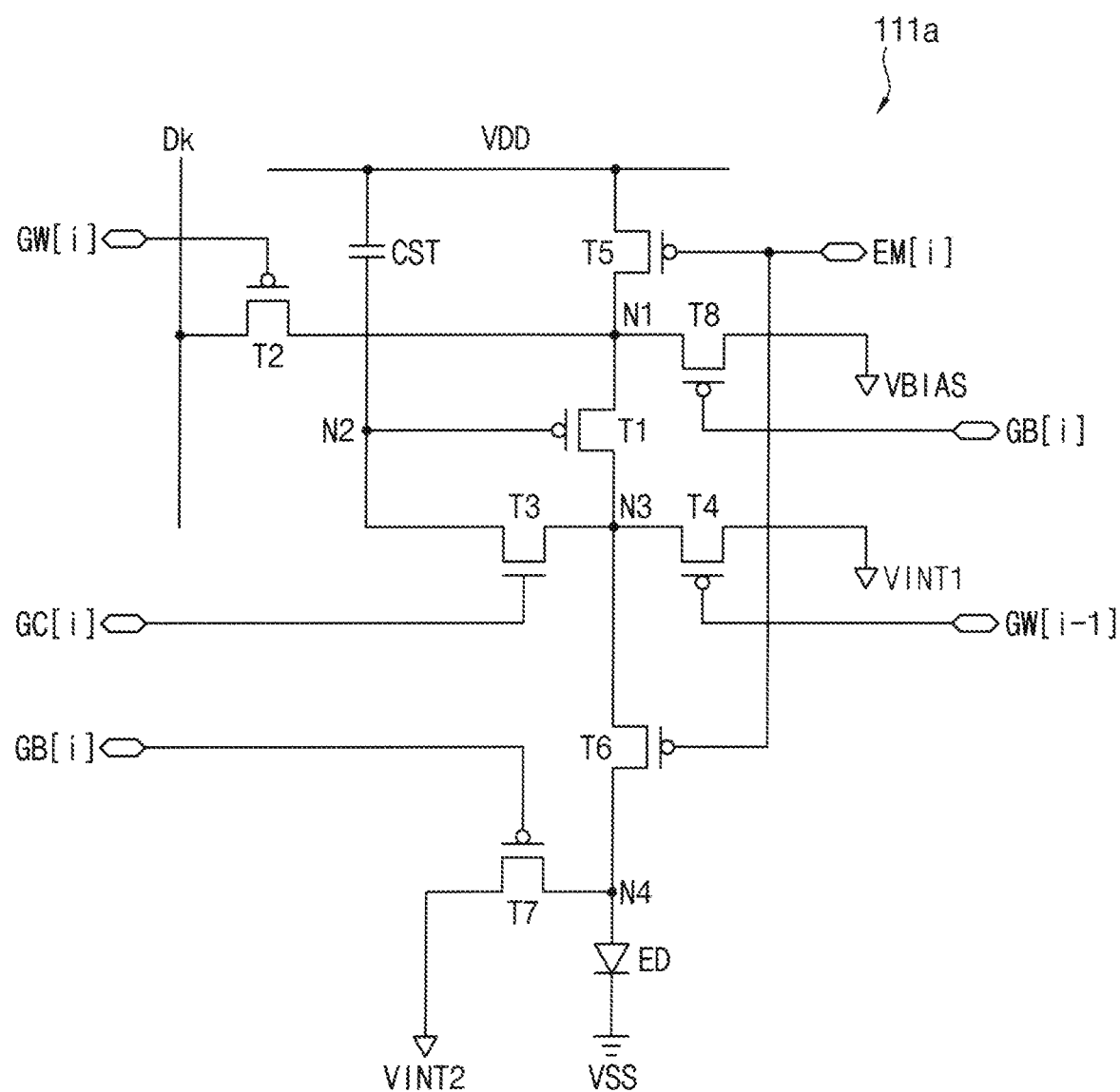
FIG. 5 is a circuit diagram illustrating an example of a pixel circuit included in the display device of FIG. 1 according to some embodiments.
Figure 6:
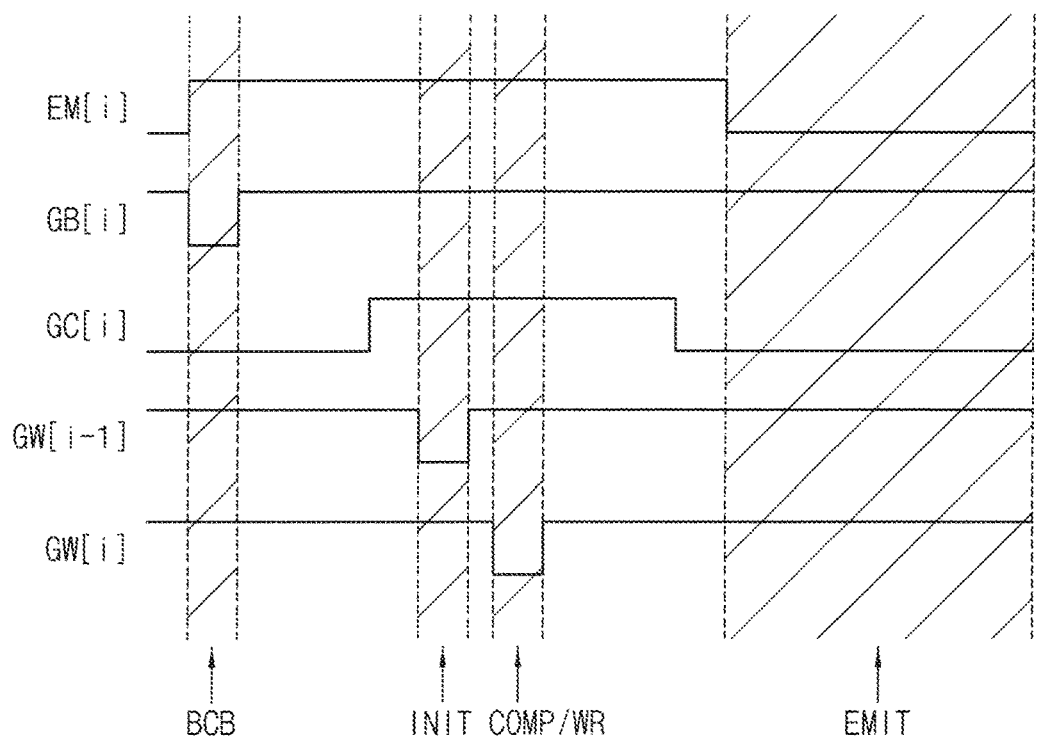
FIG. 6 is a timing diagram illustrating an example in which the pixel circuit of FIG. 5 performs a display-scan operation according to some embodiments.
Figure 7:
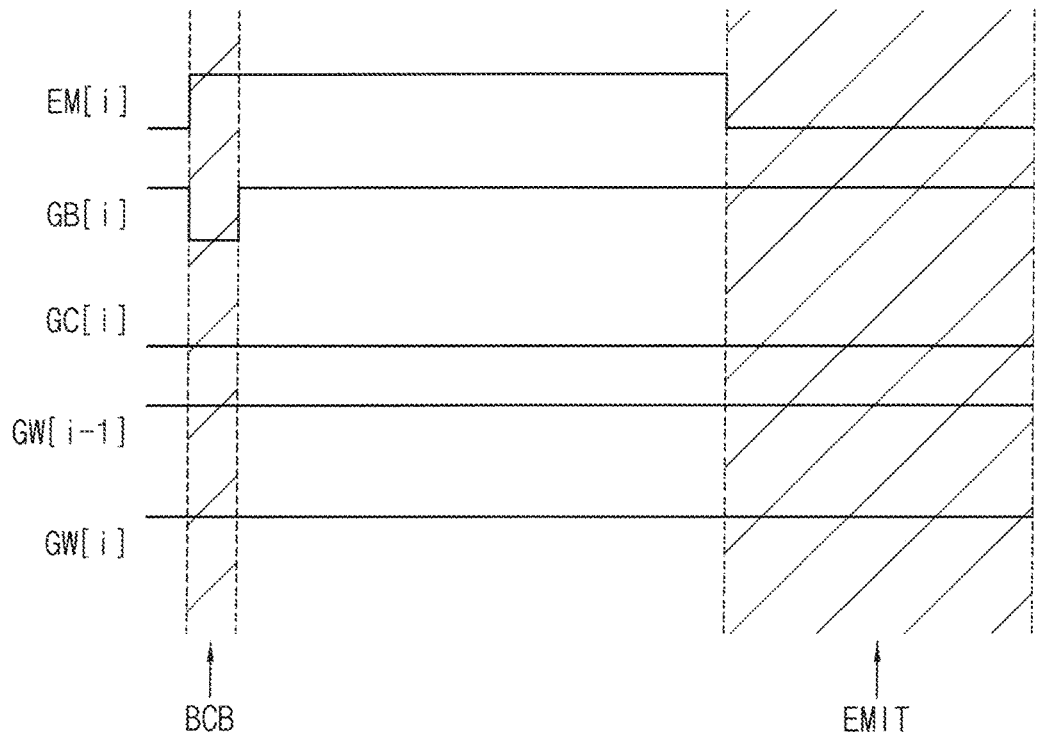
FIG. 7 is a timing diagram illustrating an example in which the pixel circuit of FIG. 5 performs a self-scan operation according to some embodiments.

FIG. 5 is a circuit diagram illustrating an example of a pixel circuit included in the display device of FIG. 1, FIG. 6 is a timing diagram illustrating an example in which the pixel circuit of FIG. 5 performs a display-scan operation, and FIG. 7 is a timing diagram illustrating an example in which the pixel circuit of FIG. 5 performs a self-scan operation.

Referring to FIGS. 5 to 7, the pixel circuit 111a may include a first transistor T1, a second transistor T2, a third transistor T3, a fourth transistor T4, a fifth transistor T5, a sixth transistor T6, a seventh transistor T7, an eighth transistor T8, a storage capacitor CST, and a light emitting element ED.

The first transistor T1 (e.g., referred to as a driving transistor) may include a first terminal connected to a first node N1, a gate terminal connected to a second node N2, and a second terminal connected to a third node N3. The first transistor T1 may control a driving current corresponding to a voltage of the second node N2 (i.e., a data signal stored in the storage capacitor CST) to flow into the light emitting element ED. The second transistor T2 (e.g., referred to as a switching transistor) may include a first terminal connected to a data line Dk (i.e., that receives the data signal), a second terminal connected to the first node N1, and a gate terminal that receives a gate control signal GW[i].

When the second transistor T2 is turned on in response to the gate control signal GW[i] (i.e., in a turn-on voltage period of the gate control signal GW[i]), the data signal applied via the data line Dk may be transferred to the first node N1. The third transistor T3 (e.g., referred to as a compensation transistor) may include a first terminal connected to the third node N3, a second terminal connected to the second node N2, and a gate terminal that receives a compensation control signal GC[i]. When the third transistor T3 is turned on in response to the compensation control signal GC[i] (i.e., in a turn-on voltage period of the compensation control signal GC[i]), the second terminal (i.e., the third node N3) and the gate terminal (i.e., the second node N2) of the first transistor T1 may be electrically connected to each other. That is, when the third transistor T3 is turned on, the first transistor T1 may be diode-connected, and thus a threshold voltage of the first transistor T1 may be compensated for. The fourth transistor T4 (e.g., referred to as an initialization transistor) may include a first terminal connected to the third node N3, a second terminal that receives a first initialization voltage VINT1, and a gate terminal that receives the previous gate control signal GW[i−1] that is applied before the gate control signal GW[i]. When the fourth transistor T4 is turned on in response to the previous gate control signal GW[i−1] (i.e., in a turn-on voltage period of the previous gate control signal GW[i−1]) while the third transistor T3 is turned on, the first initialization voltage VINT1 may be transferred to the second node N2. That is, when the fourth transistor T4 is turned on while the third transistor T3 is turned on, the second node N2 (i.e., the gate terminal of the first transistor T1) may be initialized with the first initialization voltage VINT1, and thus the first transistor T1 may have an on-bias state (i.e., may be initialized to be in the on-bias state). Here, the first initialization voltage VINT1 may be set to be a voltage that is lower than the data signal applied via the data line Dk.

For example, the data signal may be transferred to the first node N1 as the second transistor T2 is turned on, and the first transistor T1 may be turned on as the second node N2 is initialized with the first initialization voltage VINT1 that is lower than the data signal. Thus, the data signal transferred to the first node N1 may be transferred to the second node N2 via the first transistor T1 which is diode-connected. Hence, a voltage corresponding to both the data signal and the threshold voltage of the first transistor T1 may be applied to the second node N2, and thus the data signal compensated for the threshold voltage of the first transistor T1 may be stored in the storage capacitor CST. When the display panel 110 operates at a low driving frequency, a change in hysteresis of the first transistor T1 may become severe, which results in a flicker, in the case that the first initialization voltage VINT1 applied to the second node N2 is very low. For this reason, the first initialization voltage VINT1 may be set to be a voltage that is higher than a second power voltage VSS.

The fifth transistor T5 (e.g., referred to as a first emission transistor) may include a first terminal that receives a first power voltage VDD, a second terminal connected to the first node N1, and a gate terminal that receives an emission control signal EM[i]. When the fifth transistor T5 is turned on in response to the emission control signal EM[i] (i.e., in a turn-on voltage period of the emission control signal EM[i]), the light emitting element ED may emit light by the driving current flowing into the light emitting element ED via the first transistor T1 between the first power voltage VDD and the second power voltage VSS. The sixth transistor T6 (e.g., referred to as a second emission transistor) may include a first terminal connected to the third node N3, a second terminal connected to a fourth node N4, and a gate terminal that receives the emission control signal EM[i]. When the sixth transistor T6 is turned on in response to the emission control signal EM[i] (i.e., in a turn-on voltage period of the emission control signal EM[i]), the light emitting element ED may emit light by the driving current flowing into the light emitting element ED via the first transistor T1 between the first power voltage VDD and the second power voltage VSS.

Although it is described above that the fifth transistor T5 and the sixth transistor T6 commonly receive the emission control signal EM[i] to be simultaneously (or concurrently) turned on or off, in some embodiments, the fifth transistor T5 and the sixth transistor T6 may receive respective emission control signals independently of each other. The seventh transistor T7 (e.g., referred to as a reset transistor) may include a first terminal connected to the fourth node N4, a second terminal that receives a second initialization voltage VINT2, and a gate terminal that receives a bias control signal GB[i]. When the seventh transistor T7 is turned on in response to the bias control signal GB[i] (i.e., in a turn-on voltage period of the bias control signal GB[i]), the second initialization voltage VINT2 may be transferred to the fourth node N4. That is, when the seventh transistor T7 is turned on, the fourth node N4 (i.e., the first terminal of the light emitting element ED) may be reset with the second initialization voltage VINT2. For example, when the second initialization voltage VINT2 is applied to the first terminal of the light emitting element ED (e.g., an anode of an organic light emitting diode), a parasitic capacitor of the light emitting element ED may be discharged, and thus unintended micro-emission may be prevented. As a result, an ability of the pixel circuit 111a for expressing black may be improved.

According to some embodiments, the first initialization voltage VINT1 (i.e., a voltage for initializing the second node N2) and the second initialization voltage VINT2 (i.e., a voltage for initializing the fourth node N4) may be set differently from each other. In the case that the second initialization voltage VINT2 applied to the fourth node N4 becomes higher than a specific reference, the parasitic capacitor of the light emitting element ED may not be discharged, but rather may be charged. For this reason, the second initialization voltage VINT2 may be set to be a voltage that is lower than the second power voltage VSS. In some embodiments, the second initialization voltage VINT2 may be changed based on the driving time of the panel driving frame (i.e., the frame rate of the panel driving frame). In this case, because the second initialization voltage VINT2 is changed according to a driving frequency of the display panel 110, the parasitic capacitor of the light emitting element ED may be efficiently discharged.

The eighth transistor T8 may include a first terminal connected to the first node N1, a second terminal that receives a bias voltage VBIAS, and a gate terminal that receives the bias control signal GB[i]. When the eighth transistor T8 is turned on in response to the bias control signal GB[i] (i.e., in a turn-on voltage period of the bias control signal GB[i]), the bias voltage VBIAS may be transferred to the first node N1. That is, the bias voltage VBIAS may be applied to the first node N1 as the eighth transistor T8 is turned on, and a characteristics-curve of the first transistor T1 may be changed as a voltage of the first node N1 is changed to the bias voltage VBIAS. Thus, a luminance change due to hysteresis of the first transistor T1 may be improved (or prevented). For example, the bias voltage VBIAS may be set to be a specific voltage (i.e., a DC voltage) within a voltage range of the data signal or a gate-on voltage VGH of the gate control signal GW and the like. In some embodiments, the bias voltage VBIAS may be changed based on the driving time of the panel driving frame (i.e., the frame rate of the panel driving frame). In this case, because the bias voltage VBIAS is changed according to the driving frequency of the display panel 110, the luminance change due to hysteresis of the first transistor T1 may be efficiently improved (or prevented). The storage capacitor CST may include a first terminal that receives the first power voltage VDD and a second terminal connected to the second node N2.

As described above, because the data signal transferred to the first node N1 is transferred to the second node N2 via the first transistor T1, which is diode-connected, as the second transistor T2 is turned on, the storage capacitor CST may store the data signal compensated for the threshold voltage of the first transistor T1. The light emitting element ED may include a first terminal connected to the fourth node N4 and a second terminal that receives the second power voltage VSS lower than the first power voltage VDD. As described above, the light emitting element ED may emit light having a specific luminance based on the driving current supplied from the first transistor T1. According to some embodiments, the light emitting element ED may be an organic light emitting diode including an organic light emitting layer. According to some embodiments, the light emitting element ED may be an inorganic light emitting element (e.g., quantum-dot) formed of an inorganic material. In some embodiments, a plurality of light emitting elements ED may be connected in parallel and/or in serial between the second power voltage VSS and the fourth node N4. In brief, the pixel circuit 111a may have an 8T-1C structure including eight transistors T1 through T8 and one capacitor CST.

According to some embodiments, the third transistor T3 may be implemented by an oxide thin film transistor. In this case, a leakage current flowing through the third transistor T3 may be reduced as compared to the case that the third transistor T3 is implemented by a low temperature polysilicon (LTPS) thin film transistor. For example, as illustrated in FIG. 5, the third transistor T3 may be an n-channel metal oxide semiconductor (NMOS) transistor, and the first transistor T1, the second transistor T2, the fourth transistor T4, the fifth transistor T5, the sixth transistor T6, the seventh transistor T7, and the eighth transistor T8 may be p-channel metal oxide semiconductor (PMOS) transistors. However, the present disclosure is not limited thereto. For example, at least one of the first transistor T1, the second transistor T2, the fourth transistor T4, the fifth transistor T5, the sixth transistor T6, the seventh transistor T7, or the eighth transistor T8 may be an NMOS transistor. In some embodiments, the pixel circuit 111a may further include a boost capacitor including a first terminal connected to the second node N2 and a second terminal connected to the gate terminal of the third transistor T3. The boost capacitor may boost a voltage of the second node N2.

According to some embodiments, the pixel circuit 111a may perform one display-scan operation when the driving time of the panel driving frame is the minimum driving time (i.e., when the driving frequency of the display panel 110 is the maximum driving frequency) and may perform one display-scan operation and at least one self-scan operation when the driving time of the panel driving frame is not the minimum driving time (i.e., when the driving frequency of the display panel 110 is lower than the maximum driving frequency). As described above, the display-scan operation may be an operation that receives the data signal to emit light using the light emitting element ED, and the self-scan operation may be an operation that changes characteristics of the first transistor T1 (i.e., the driving transistor).

As illustrated in FIG. 6, when the pixel circuit 111a performs the display-scan operation, each of the gate control signal GW[i], the previous gate control signal GW[i−1], the compensation control signal GC[i], the bias control signal GB[i], and the emission control signal EM[i] may include a turn-on voltage period (e.g., a logic low period of the gate control signal GW[i], a logic low period of the previous gate control signal GW[i−1], a logic low period of the bias control signal GB[i], a logic low period of the emission control signal EM[i], and a logic high period of the compensation control signal GC[i] in FIG. 6). According to some embodiments, a turn-on voltage period of the gate control signal GW[i], a turn-on voltage period of the previous gate control signal GW[i−1], a turn-on voltage period of the compensation control signal GC[i], and a turn-on voltage period of the bias control signal GB[i] may be positioned in a turn-off voltage period of the emission control signal EM[i]. In addition, a turn-on voltage period of the bias control signal GB[i] may be positioned before a turn-on voltage period of the compensation control signal GC[i]. Further, a turn-on voltage period of the previous gate control signal GW[i−1] and a turn-on voltage period of the gate control signal GW[i] may be sequentially positioned in a turn-on voltage period of the compensation control signal GC[i].

For example, a reset-bias operation BCB may be performed in a turn-on voltage period of the bias control signal GB[i] when a turn-off voltage period of the emission control signal EM[i] begins. That is, while the driving current does not flow into the light emitting element ED as the fifth transistor T5 and the sixth transistor T6 are turned off, the second initialization voltage VINT2 may be applied to the fourth node N4 as the seventh transistor T7 is turned on, and the bias voltage VBIAS may be applied to the first node N1 as the eighth transistor T8 is turned on. Subsequently, an initializing operation INIT may be performed in a turn-on voltage period of the compensation control signal GC[i] and a turn-on voltage period of the previous gate control signal GW[i−1]. That is, the first initialization voltage VINT1 may be applied to the second node N2 as the third transistor T3 is turned on in a turn-on voltage period of the compensation control signal GC[i] and the fourth transistor T4 is turned on in a turn-on voltage period of the previous gate control signal GW[i−1]. Next, a threshold voltage compensating and data writing operation COMP/WR may be performed in a turn-on voltage period of the compensation control signal GC[i] and a turn-on voltage period of the gate control signal GW[i].

That is, because the third transistor T3 is turned on in a turn-on voltage period of the compensation control signal GC[i], the second transistor T2 is turned on in a turn-on voltage period of the gate control signal GW[i], and the first transistor T1 is turned on as the second node N2 is initialized with the first initialization voltage VINT1 that is lower than the data signal, the data signal compensated for the threshold voltage of the first transistor T1 may be stored in the storage capacitor CST. Subsequently, a light emitting operation EMIT may be performed in a turn-on voltage period of the emission control signal EM[i]. That is, the driving current may flow into the light emitting element ED, and thus the light emitting element ED may emit light as the fifth transistor T5 and the sixth transistor T6 are turned on in a turn-on voltage period of the emission control signal EM[i].

As illustrated in FIG. 7, when the pixel circuit 111a performs the self-scan operation, each of the bias control signal GB[i] and the emission control signal EM[i] may include a turn-on voltage period (e.g., a logic low period of the bias control signal GB[i] and a logic low period of the emission control signal EM[i] in FIG. 7), and each of the gate control signal GW[i], the previous gate control signal GW[i−1], and the compensation control signal GC[i] may not include a turn-on voltage period. In other words, when the pixel circuit 111a performs the self-scan operation, each of the gate control signal GW[i], the previous gate control signal GW[i−1], and the compensation control signal GC[i] may include only a turn-off voltage period (e.g., a logic high period of the gate control signal GW[i], a logic high period of the previous gate control signal GW[i−1], and a logic low period of the compensation control signal GC[i] in FIG. 7). According to some embodiments, a turn-on voltage period of the bias control signal GB[i] may be positioned in a turn-off voltage period of the emission control signal EM[i].

For example, a reset-bias operation BCB may be performed in a turn-on voltage period of the bias control signal GB[i] when a turn-off voltage period of the emission control signal EM[i] begins. That is, while the driving current does not flow into the light emitting element ED as the fifth transistor T5 and the sixth transistor T6 are turned off, the second initialization voltage VINT2 may be applied to the fourth node N4 as the seventh transistor T7 is turned on, and the bias voltage VBIAS may be applied to the first node N1 as the eighth transistor T8 is turned on. Subsequently, a light emitting operation EMIT may be performed in a turn-on voltage period of the emission control signal EM[i]. That is, the driving current may flow into the light emitting element ED, and thus the light emitting element ED may emit light as the fifth transistor T5 and the sixth transistor T6 are turned on in a turn-on voltage period of the emission control signal EM[i].

In brief, the pixel circuit 111a may prevent a phenomenon that a flicker occurs on the display panel 110 due to hysteresis characteristics as characteristics of the driving transistor (i.e., the first transistor T1) are fixed in a specific state during the panel driving frame by including the first transistor T1 including the first terminal connected to the first node N1, the gate terminal connected to the second node N2, and the second terminal connected to the third node N3, the second transistor T2 including the first terminal that receives the data signal, the second terminal connected to the first node N1, and the gate terminal that receives the gate control signal GW[i], the third transistor T3 including the first terminal connected to the third node N3, the second terminal connected to the second node N2, and the gate terminal that receives the compensation control signal GC[i], the fourth transistor T4 including the first terminal connected to the third node N3, the second terminal that receives the first initialization voltage VINT1, and the gate terminal that receives the previous gate control signal GW[i−1] that is applied before the gate control signal GW[i], the fifth transistor T5 including the first terminal that receives the first power voltage VDD, the second terminal connected to the first node N1, and the gate terminal that receives the emission control signal EM[i], the sixth transistor T6 including the first terminal connected to the third node N3, the second terminal connected to the fourth node N4, and the gate terminal that receives the emission control signal EM[i], the seventh transistor T7 including the first terminal connected to the fourth node N4, the second terminal that receives the second initialization voltage VINT2, and the gate terminal that receives the bias control signal GB[i], the eighth transistor T8 including the first terminal connected to the first node N1, the second terminal that receives the bias voltage VBIAS, and the gate terminal that receives the bias control signal GB[i], the storage capacitor CST including the first terminal that receives the first power voltage VDD and the second terminal connected to the second node N2, and the light emitting element ED including the first terminal connected to the fourth node N4 and the second terminal that receives the second power voltage VSS lower than the first power voltage VDD (in some embodiments, the pixel circuit 111a may further include the boost capacitor including the first terminal connected to the second node N2 and the second terminal connected to the gate terminal of the third transistor T3), by performing one display-scan operation, which is the operation that receives the data signal to emit light using the light emitting element ED, when the driving time of the panel driving frame is the minimum driving time, and by performing one display-scan operation and at least one self-scan operation, which is the operation that changes characteristics of the driving transistor T1, when the driving time of the panel driving frame is not the minimum driving time.

In addition, the pixel circuit 111a may prevent or reduce a phenomenon in which luminance non-uniformity occurs due to deviations of the falling time and/or the rising time of the compensation control signal GC[i] according to the location of the pixel circuit 111a in the display panel 110 by performing the initializing operation INIT, which is the operation that initializes the gate terminal of the driving transistor T1, without receiving an initialization control signal (i.e., because a related art initialization driver that provides the initialization control signal is not located at one side of the display panel 110, an additional compensation driver that provides the compensation control signal GC[i] can be located at a space where the related art initialization driver may be located, and thus the compensation control signal GC[i] can be provided from both sides of the display panel 110). As a result, the display device 100 including the pixel circuit 111a may provide a high quality image to a viewer (or user) even when the display panel 110 operates at a low driving frequency.

Figure 8:
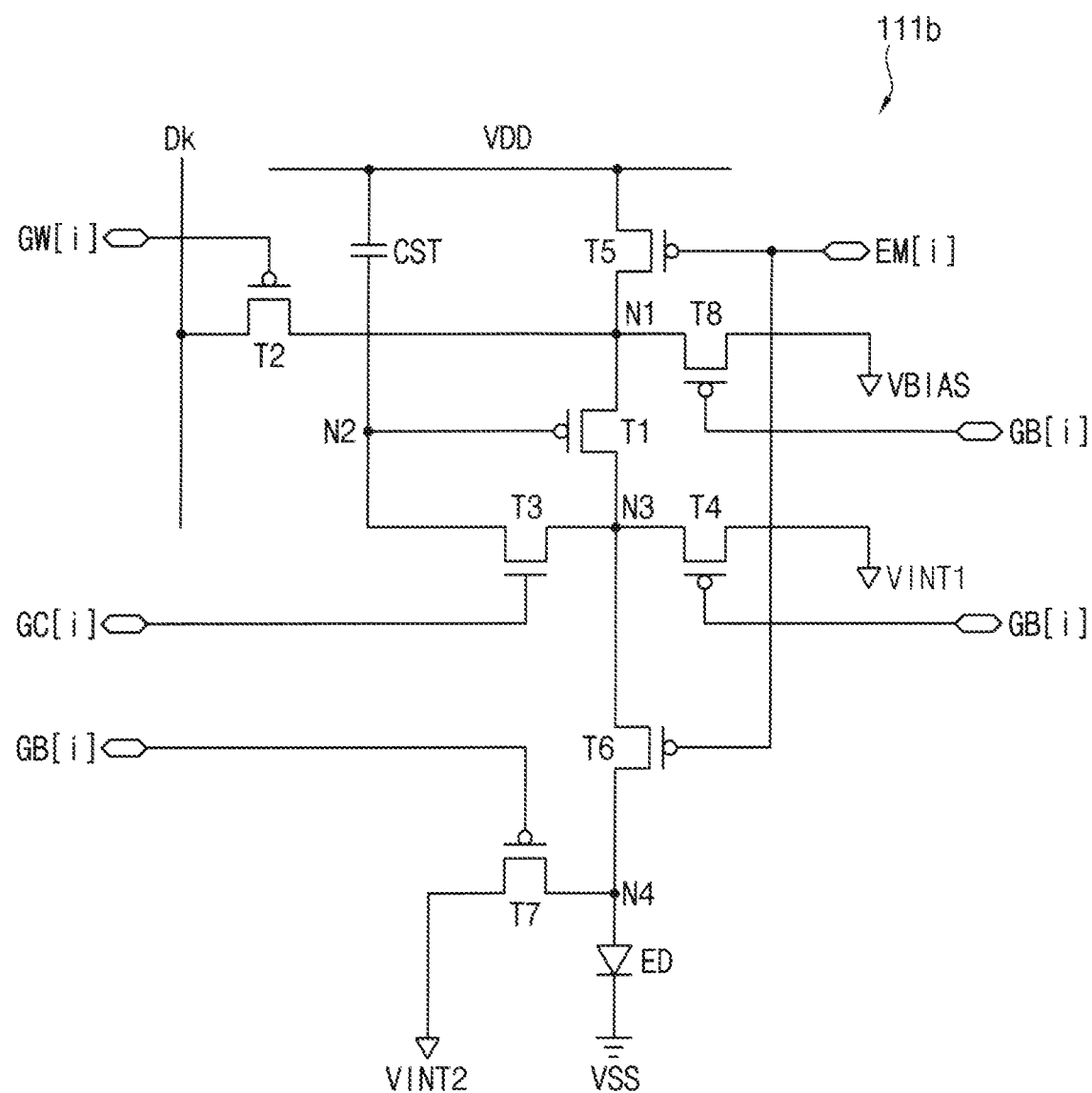
FIG. 8 is a circuit diagram illustrating another example of a pixel circuit included in the display device of FIG. 1 according to some embodiments.
Figure 9:
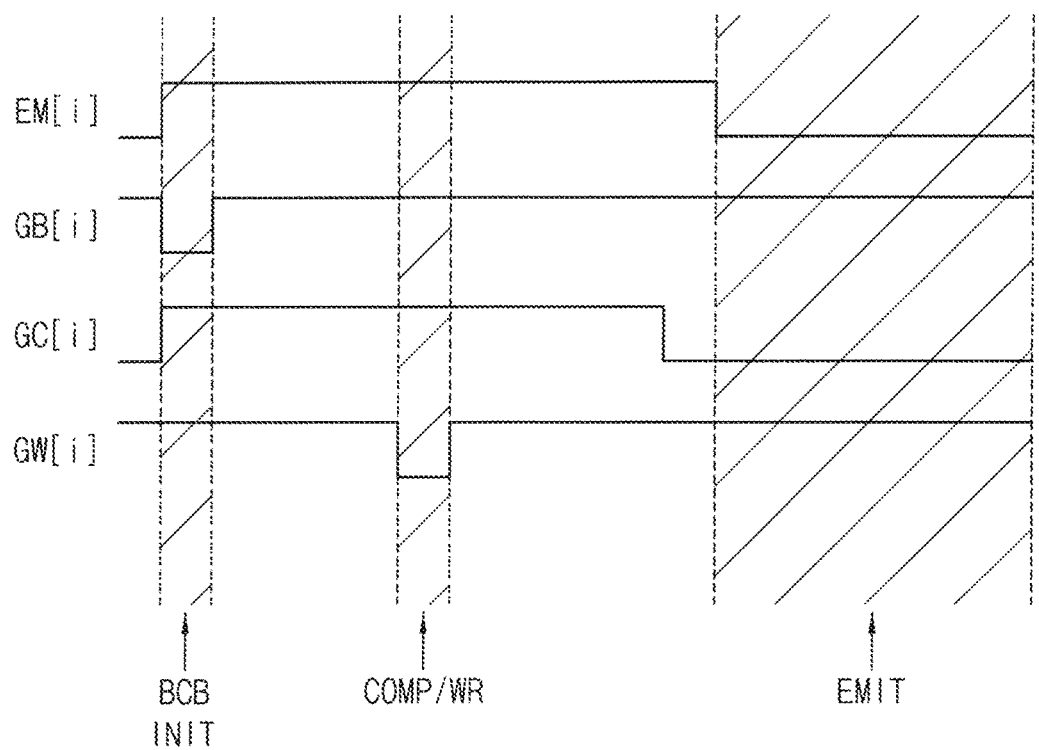
FIG. 9 is a timing diagram illustrating an example in which the pixel circuit of FIG. 8 performs a display-scan operation according to some embodiments.
Figure 10:
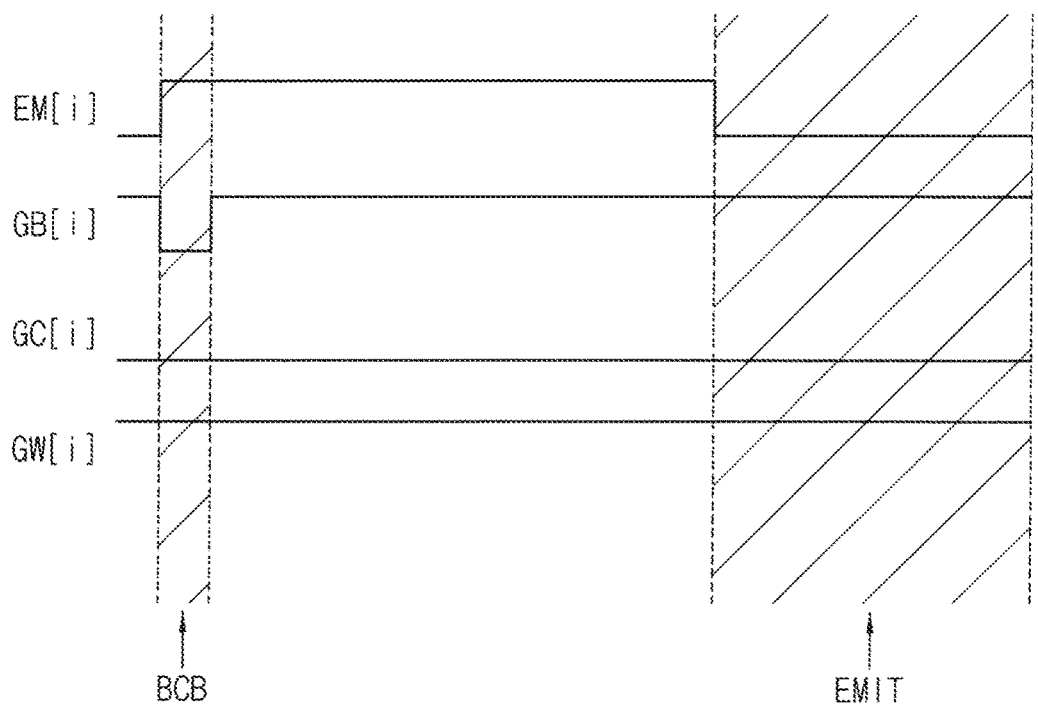
FIG. 10 is a timing diagram illustrating an example in which the pixel circuit of FIG. 8 performs a self-scan operation according to some embodiments.

FIG. 8 is a circuit diagram illustrating another example of a pixel circuit included in the display device of FIG. 1, FIG. 9 is a timing diagram illustrating an example in which the pixel circuit of FIG. 8 performs a display-scan operation, and FIG. 10 is a timing diagram illustrating an example in which the pixel circuit of FIG. 8 performs a self-scan operation.

Referring to FIGS. 8 to 10, the pixel circuit 111b may include a first transistor T1, a second transistor T2, a third transistor T3, a fourth transistor T4, a fifth transistor T5, a sixth transistor T6, a seventh transistor T7, an eighth transistor T8, a storage capacitor CST, and a light emitting element ED. In some embodiments, the pixel circuit 111b may boost a voltage of a second node N2 by further including a boost capacitor that includes a first terminal connected to the second node N2 and a second terminal connected to a gate terminal of the third transistor T3. Except for a signal that is applied to a gate terminal of the fourth transistor T4, the pixel circuit 111b of FIG. 8 may be substantially the same as the pixel circuit 111a of FIG. 5. Thus, duplicated description therebetween will not be repeated.

The third transistor T3 may include a first terminal connected to the third node N3, a second terminal connected to the second node N2, and a gate terminal that receives a compensation control signal GC[i]. When the third transistor T3 is turned on in response to the compensation control signal GC[i] (i.e., in a turn-on voltage period of the compensation control signal GC[i]), the second terminal (i.e., the third node N3) and the gate terminal (i.e., the second node N2) of the first transistor T1 may be electrically connected to each other. That is, when the third transistor T3 is turned on, the first transistor T1 may be diode-connected, and thus a threshold voltage of the first transistor T1 may be compensated for. According to some embodiments, the third transistor T3 may be implemented by an oxide thin film transistor. In this case, a leakage current flowing through the third transistor T3 may be reduced as compared to the case that the third transistor T3 is implemented by a low temperature poly-silicon (LTPS) thin film transistor. For example, as illustrated in FIG. 8, the third transistor T3 may be an NMOS transistor, and the first transistor T1, the second transistor T2, the fourth transistor T4, the fifth transistor T5, the sixth transistor T6, the seventh transistor T7, and the eighth transistor T8 may be PMOS transistors. However, the present disclosure is not limited thereto. For example, at least one of the first transistor T1, the second transistor T2, the fourth transistor T4, the fifth transistor T5, the sixth transistor T6, the seventh transistor T7, or the eighth transistor T8 may be an NMOS transistor. The fourth transistor T4 may include a first terminal connected to the third node N3, a second terminal that receives a first initialization voltage VINT1, and a gate terminal that receives a bias control signal GB[i]. When the fourth transistor T4 is turned on in response to the bias control signal GB[i] (i.e., in a turn-on voltage period of the bias control signal GB[i]) while the third transistor T3 is turned on, the first initialization voltage VINT1 may be transferred to the second node N2. That is, when the fourth transistor T4 is turned on while the third transistor T3 is turned on, the second node N2 (i.e., the gate terminal of the first transistor T1) may be initialized with the first initialization voltage VINT1, and thus the first transistor T1 may have an on-bias state (i.e., may be initialized to be in the on-bias state). Here, the first initialization voltage VINT1 may be set to be a voltage that is lower than the data signal applied via the data line Dk.

For example, the data signal may be transferred to the first node N1 as the second transistor T2 is turned on, and the first transistor T1 may be turned on as the second node N2 is initialized with the first initialization voltage VINT1 that is lower than the data signal. Thus, the data signal transferred to the first node N1 may be transferred to the second node N2 via the first transistor T1 which is diode-connected. Hence, a voltage corresponding to both the data signal and the threshold voltage of the first transistor T1 may be applied to the second node N2, and thus the data signal compensated for the threshold voltage of the first transistor T1 may be stored in the storage capacitor CST. When the display panel 110 operates at a low driving frequency, a change in hysteresis of the first transistor T1 may become severe, which results in a flicker, in the case that the first initialization voltage VINT1 applied to the second node N2 is very low. For this reason, the first initialization voltage VINT1 may be set to be a voltage that is higher than a second power voltage VSS.

According to some embodiments, the pixel circuit 111b may perform one display-scan operation when the driving time of the panel driving frame is the minimum driving time (i.e., when the driving frequency of the display panel 110 is the maximum driving frequency) and may perform one display-scan operation and at least one self-scan operation when the driving time of the panel driving frame is not the minimum driving time (i.e., when the driving frequency of the display panel 110 is lower than the maximum driving frequency). As described above, the display-scan operation may be an operation that receives the data signal to emit light using the light emitting element ED, and the self-scan operation may be an operation that changes characteristics of the first transistor T1 (i.e., the driving transistor).

As illustrated in FIG. 9, when the pixel circuit 111b performs the display-scan operation, each of the gate control signal GW[i], the compensation control signal GC[i], the bias control signal GB[i], and the emission control signal EM[i] may include a turn-on voltage period (e.g., a logic low period of the gate control signal GW[i], a logic low period of the bias control signal GB[i] and a logic low period of the emission control signal EM[i], and a logic high period of the compensation control signal GC[i] in FIG. 9). According to some embodiments, a turn-on voltage period of the gate control signal GW[i], a turn-on voltage period of the compensation control signal GC[i], and a turn-on voltage period of the bias control signal GB[i] may be positioned in a turn-off voltage period of the emission control signal EM[i]. In addition, a turn-on voltage period of the bias control signal GB[i] and a turn-on voltage period of the gate control signal GW[i] may be sequentially positioned in a turn-on voltage period of the compensation control signal GC[i].

For example, a reset-bias operation BCB and an initializing operation INIT may be performed in a turn-on voltage period of the bias control signal GB[i] when a turn-off voltage period of the emission control signal EM[i] and a turn-on voltage period of the compensation control signal GC[i] begin. That is, while the driving current does not flow into the light emitting element ED as the fifth transistor T5 and the sixth transistor T6 are turned off, the second initialization voltage VINT2 may be applied to the fourth node N4 as the seventh transistor T7 is turned on, and the bias voltage VBIAS may be applied to the first node N1 as the eighth transistor T8 is turned on. In addition, while the driving current does not flow into the light emitting element ED as the fifth transistor T5 and the sixth transistor T6 are turned off, the first initialization voltage VNIT1 may be applied to the second node N2 as the third transistor T3 and the fourth transistor T4 are turned on. Next, a threshold voltage compensating and data writing operation COMP/WR may be performed in a turn-on voltage period of the compensation control signal GC[i] and a turn-on voltage period of the gate control signal GW[i].

That is, because the third transistor T3 is turned on in a turn-on voltage period of the compensation control signal GC[i], the second transistor T2 is turned on in a turn-on voltage period of the gate control signal GW[i], and the first transistor T1 is turned on as the second node N2 is initialized with the first initialization voltage VINT1 that is lower than the data signal, the data signal compensated for the threshold voltage of the first transistor T1 may be stored in the storage capacitor CST. Subsequently, a light emitting operation EMIT may be performed in a turn-on voltage period of the emission control signal EM[i]. That is, the driving current may flow into the light emitting element ED, and thus the light emitting element ED may emit light as the fifth transistor T5 and the sixth transistor T6 are turned on in a turn-on voltage period of the emission control signal EM[i].

As illustrated in FIG. 10, when the pixel circuit 111b performs the self-scan operation, each of the bias control signal GB[i] and the emission control signal EM[i] may include a turn-on voltage period (e.g., a logic low period of the bias control signal GB[i] and a logic low period of the emission control signal EM[i] in FIG. 10), and each of the gate control signal GW[i] and the compensation control signal GC[i] may not include a turn-on voltage period. In other words, when the pixel circuit 111b performs the self-scan operation, each of the gate control signal GW[i] and the compensation control signal GC[i] may include only a turn-off voltage period (e.g., a logic high period of the gate control signal GW[i] and a logic low period of the compensation control signal GC[i] in FIG. 10).

According to some embodiments, a turn-on voltage period of the bias control signal GB[i] may be positioned in a turn-off voltage period of the emission control signal EM[i]. For example, a reset-bias operation BCB may be performed in a turn-on voltage period of the bias control signal GB[i] when a turn-off voltage period of the emission control signal EM[i] begins. That is, while the driving current does not flow into the light emitting element ED as the fifth transistor T5 and the sixth transistor T6 are turned off, the second initialization voltage VINT2 may be applied to the fourth node N4 as the seventh transistor T7 is turned on, and the bias voltage VBIAS may be applied to the first node N1 as the eighth transistor T8 is turned on. Subsequently, a light emitting operation EMIT may be performed in a turn-on voltage period of the emission control signal EM[i]. That is, the driving current may flow into the light emitting element ED, and thus the light emitting element ED may emit light as the fifth transistor T5 and the sixth transistor T6 are turned on in a turn-on voltage period of the emission control signal EM[i].

In brief, the pixel circuit 111b may prevent a phenomenon that a flicker occurs on the display panel 110 due to hysteresis characteristics as characteristics of the driving transistor T1 are fixed in a specific state during the panel driving frame by including the first transistor T1 including the first terminal connected to the first node N1, the gate terminal connected to the second node N2, and the second terminal connected to the third node N3, the second transistor T2 including the first terminal that receives the data signal, the second terminal connected to the first node N1, and the gate terminal that receives the gate control signal GW[i], the third transistor T3 including the first terminal connected to the third node N3, the second terminal connected to the second node N2, and the gate terminal that receives the compensation control signal GC[i], the fourth transistor T4 including the first terminal connected to the third node N3, the second terminal that receives the first initialization voltage VINT1, and the gate terminal that receives the compensation control signal GC[i], the fifth transistor T5 including the first terminal that receives the first power voltage VDD, the second terminal connected to the first node N1, and the gate terminal that receives the emission control signal EM[i], the sixth transistor T6 including the first terminal connected to the third node N3, the second terminal connected to the fourth node N4, and the gate terminal that receives the emission control signal EM[i], the seventh transistor T7 including the first terminal connected to the fourth node N4, the second terminal that receives the second initialization voltage VINT2, and the gate terminal that receives the bias control signal GB[i], the eighth transistor T8 including the first terminal connected to the first node N1, the second terminal that receives the bias voltage VBIAS, and the gate terminal that receives the bias control signal GB[i], the storage capacitor CST including the first terminal that receives the first power voltage VDD and the second terminal connected to the second node N2, and the light emitting element ED including the first terminal connected to the fourth node N4 and the second terminal that receives the second power voltage VSS lower than the first power voltage VDD (in some embodiments, the pixel circuit 111b may further include the boost capacitor including the first terminal connected to the second node N2 and the second terminal connected to the gate terminal of the third transistor T3), by performing one display-scan operation, which is the operation that receives the data signal to emit light using the light emitting element ED, when the driving time of the panel driving frame is the minimum driving time, and by performing one display-scan operation and at least one self-scan operation, which is the operation that changes characteristics of the driving transistor T1, when the driving time of the panel driving frame is not the minimum driving time.

In addition, the pixel circuit 111b may prevent a phenomenon that luminance non-uniformity occurs due to deviations of the falling time and/or the rising time of the compensation control signal GC[i] according to the location of the pixel circuit 111b in the display panel 110 by performing the initializing operation INIT, which is the operation that initializes the gate terminal of the driving transistor T1, without receiving an initialization control signal (i.e., because a related art initialization driver that provides the initialization control signal is not located at one side of the display panel 110, an additional compensation driver that provides the compensation control signal GC[i] can be located at a space where the related art initialization driver may be located, and thus the compensation control signal GC[i] can be provided from both sides of the display panel 110). As a result, the display device 100 including the pixel circuit 111b may provide a high quality image to a viewer (or user) even when the display panel 110 operates at a low driving frequency.

Figure 11:
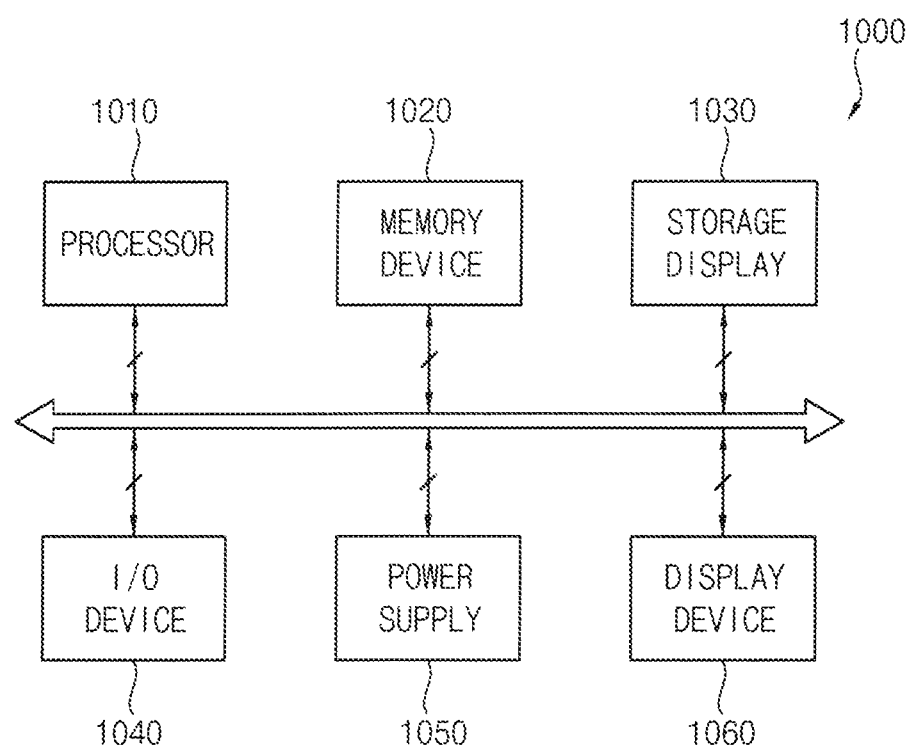
FIG. 11 is a block diagram illustrating an electronic device according to some embodiments.
Figure 12:
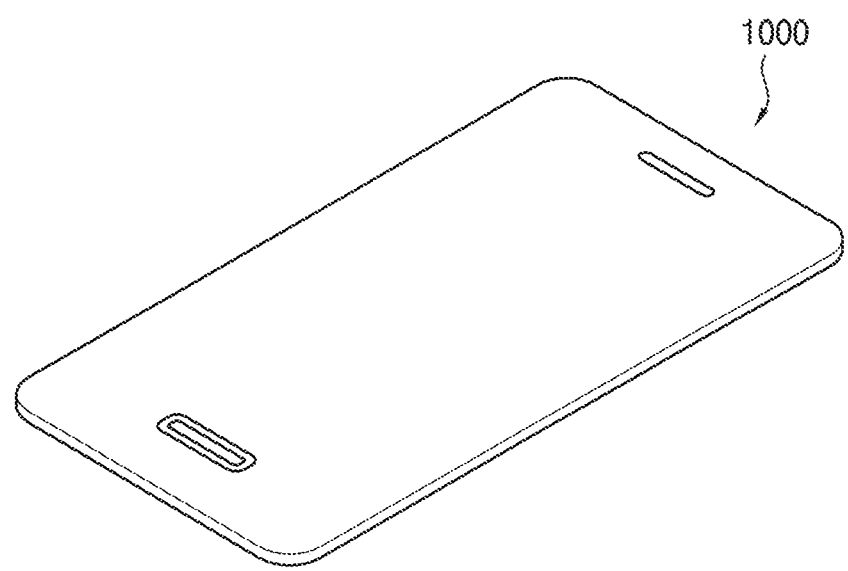
FIG. 12 is a diagram illustrating an example in which the electronic device of FIG. 11 is implemented as a smart phone according to some embodiments.

FIG. 11 is a block diagram illustrating an electronic device according to some embodiments, and FIG. 12 is a diagram illustrating an example in which the electronic device of FIG. 11 is implemented as a smart phone.

Referring to FIGS. 11 and 12, the electronic device 1000 may include a processor 1010, a memory device 1020, a storage device 1030, an input/output (I/O) device 1040, a power supply 1050, and a display device 1060. Here, the display device 1060 may be the display device 100 of FIG. 1. In addition, the electronic device 1000 may further include a plurality of ports for communicating with a video card, a sound card, a memory card, a universal serial bus (USB) device, other electronic devices, and the like. According to some embodiments, as illustrated in FIG. 12, the electronic device 1000 may be implemented as a smart phone. However, the electronic device 1000 is not limited thereto. For example, the electronic device 1000 may be implemented as a cellular phone, a video phone, a smart pad, a smart watch, a tablet PC, a car navigation system, a computer monitor, a laptop, a head mounted display (HMD) device, and the like.

The processor 1010 may perform various computing functions. The processor 1010 may be a micro-processor, a central processing unit (CPU), an application processor (AP), and the like. The processor 1010 may be coupled to other components via an address bus, a control bus, a data bus, etc. Further, the processor 1010 may be coupled to an extended bus such as a peripheral component interconnection (PCI) bus. The memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or at least one volatile memory device such as a dynamic random access memory (DRAM) device, a static random access memory (SRAM) device, a mobile DRAM device, and the like. The storage device 1030 may include a solid state drive (SSD) device, a hard disk drive (HDD) device, a CD-ROM device, and the like. The I/O device 1040 may include an input device such as a keyboard, a keypad, a mouse device, a touch-pad, a touch-screen, and the like and an output device such as a printer, a speaker, and the like. In some embodiments, the display device 1060 may be included in the I/O device 1040. The power supply 1050 may provide power for operations of the electronic device 1000. The display device 1060 may be coupled to other components via the buses or other communication links.

The display device 1060 may display an image corresponding to visual information of the electronic device 1000. Here, the display device 1060 may be an organic light emitting display device or a quantum-dot light emitting display device. However, the display device 1060 is not limited thereto. The display device 1060 may include a pixel circuit that can prevent a phenomenon that a flicker occurs on a display panel due to hysteresis characteristics as characteristics of a driving transistor are fixed in a specific state during a panel driving frame by performing one display-scan operation when a driving time of the panel driving frame is a minimum driving time and by performing one display-scan operation and at least one self-scan operation when the driving time of the panel driving frame is not the minimum driving time and that can prevent a phenomenon that luminance non-uniformity occurs on the display panel by performing an initializing operation, which is an operation that initializes a gate terminal of the driving transistor, without receiving an initialization control signal (i.e., by having a structure that can make a compensation control signal be provided from both sides of the display panel).

Thus, the display device 1060 may provide a high quality image to a viewer (or user) even when the display panel operates at a low driving frequency. For example, the pixel circuit included in the display device 1060 may include a first transistor including a first terminal connected to a first node, a gate terminal connected to a second node, and a second terminal connected to a third node, a second transistor including a first terminal that receives a data signal, a second terminal connected to the first node, and a gate terminal that receives a gate control signal, a third transistor including a first terminal connected to the third node, a second terminal connected to the second node, and a gate terminal that receives a compensation control signal, a fourth transistor including a first terminal connected to the third node, a second terminal that receives a first initialization voltage, and a gate terminal that receives a bias control signal or a previous gate control signal that is applied before the gate control signal, a fifth transistor including a first terminal that receives a first power voltage, a second terminal connected to the first node, and a gate terminal that receives an emission control signal, a sixth transistor including a first terminal connected to the third node, a second terminal connected to a fourth node, and a gate terminal that receives the emission control signal, a seventh transistor including a first terminal connected to the fourth node, a second terminal that receives a second initialization voltage, and a gate terminal that receives a bias control signal, an eighth transistor including a first terminal connected to the first node, a second terminal that receives a bias voltage, and a gate terminal that receives the bias control signal, a storage capacitor including a first terminal that receives the first power voltage and a second terminal connected to the second node, and a light emitting element including a first terminal connected to the fourth node and a second terminal that receives a second power voltage lower than the first power voltage. In some embodiments, the pixel circuit included in the display device 1060 may further include a boost capacitor including a first terminal connected to the second node and a second terminal connected to the gate terminal of the third transistor. Because the pixel circuit included in the display device 1060 is described above, duplicated description related thereto will not be repeated.

Aspects of some embodiments of the present disclosure may be applied to a display device and an electronic device including the display device. For example, the present disclosure may be applied to a smart phone, a cellular phone, a video phone, a smart pad, a smart watch, a tablet PC, a car navigation system, a television, a computer monitor, a laptop, a digital camera, a head mounted display (HMD) device, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and their equivalents.

What is claimed is:

1. A pixel circuit comprising:
    a first transistor including a first terminal connected to a first node, a gate terminal connected to a second node, and a second terminal connected to a third node;
    a second transistor including a first terminal configured to receive a data signal, a second terminal connected to the first node, and a gate terminal configured to receive a gate control signal;
    a third transistor including a first terminal connected to the third node, a second terminal connected to the second node, and a gate terminal configured to receive a compensation control signal;
    a fourth transistor including a first terminal connected to the third node, a second terminal configured to receive a first initialization voltage, and a gate terminal configured to receive a previous gate control signal that is applied before the gate control signal;
    a fifth transistor including a first terminal configured to receive a first power voltage, a second terminal connected to the first node, and a gate terminal configured to receive an emission control signal;
    a sixth transistor including a first terminal connected to the third node, a second terminal connected to a fourth node, and a gate terminal configured to receive the emission control signal;
    a seventh transistor including a first terminal connected to the fourth node, a second terminal configured to receive a second initialization voltage, and a gate terminal configured to receive a bias control signal;

an eighth transistor including a first terminal connected to the first node, a second terminal configured to receive a bias voltage, and a gate terminal configured to receive the bias control signal;
a storage capacitor including a first terminal configured to receive the first power voltage and a second terminal connected to the second node; and
a light emitting element including a first terminal connected to the fourth node and a second terminal configured to receive a second power voltage lower than the first power voltage,
wherein the pixel circuit is configured to perform one display-scan operation in response to a driving time of a panel driving frame being a minimum driving time and to perform one display-scan operation and at least one self-scan operation in response to the driving time of the panel driving frame not being the minimum driving time.

2. The pixel circuit of claim 1, wherein the third transistor is an oxide thin film transistor.

3. The pixel circuit of claim 2, wherein the third transistor is an n-channel metal oxide semiconductor (NMOS) transistor.

4. The pixel circuit of claim 1, wherein, in response to the display-scan operation being performed, each of the gate control signal, the previous gate control signal, the compensation control signal, the bias control signal, and the emission control signal includes a turn-on voltage period.

5. The pixel circuit of claim 4, wherein the turn-on voltage period of the gate control signal, the turn-on voltage period of the previous gate control signal, the turn-on voltage period of the compensation control signal, and the turn-on voltage period of the bias control signal are positioned in a turn-off voltage period of the emission control signal.

6. The pixel circuit of claim 5, wherein the turn-on voltage period of the bias control signal is positioned before the turn-on voltage period of the compensation control signal.

7. The pixel circuit of claim 6, wherein the turn-on voltage period of the previous gate control signal and the turn-on voltage period of the gate control signal are sequentially positioned in the turn-on voltage period of the compensation control signal.

8. The pixel circuit of claim 1, wherein, in response to the self-scan operation being performed, each of the bias control signal and the emission control signal includes a turn-on voltage period, and each of the gate control signal, the previous gate control signal, and the compensation control signal does not include the turn-on voltage period.

9. The pixel circuit of claim 8, wherein the turn-on voltage period of the bias control signal is positioned in a turn-off voltage period of the emission control signal.

10. A pixel circuit comprising:
a first transistor including a first terminal connected to a first node, a gate terminal connected to a second node, and a second terminal connected to a third node;
a second transistor including a first terminal configured to receive a data signal, a second terminal connected to the first node, and a gate terminal configured to receive a gate control signal;
a third transistor including a first terminal connected to the third node, a second terminal connected to the second node, and a gate terminal configured to receive a compensation control signal;
a fourth transistor including a first terminal connected to the third node, a second terminal configured to receive a first initialization voltage, and a gate terminal configured to receive a bias control signal;

a fifth transistor including a first terminal configured to receive a first power voltage, a second terminal connected to the first node, and a gate terminal configured to receive an emission control signal;
a sixth transistor including a first terminal connected to the third node, a second terminal connected to a fourth node, and a gate terminal configured to receive the emission control signal;
a seventh transistor including a first terminal connected to the fourth node, a second terminal configured to receive a second initialization voltage, and a gate terminal configured to receive the bias control signal;
an eighth transistor including a first terminal connected to the first node, a second terminal configured to receive a bias voltage, and a gate terminal configured to receive the bias control signal;
a storage capacitor including a first terminal configured to receive the first power voltage and a second terminal connected to the second node; and
a light emitting element including a first terminal connected to the fourth node and a second terminal configured to receive a second power voltage lower than the first power voltage,
wherein the pixel circuit is configured to perform one display-scan operation in response to a driving time of a panel driving frame being a minimum driving time and to perform one display-scan operation and at least one self-scan operation in response to the driving time of the panel driving frame not being the minimum driving time.

11. The pixel circuit of claim 10, wherein the third transistor is an oxide thin film transistor.

12. The pixel circuit of claim 11, wherein the third transistor is an n-channel metal oxide semiconductor (NMOS) transistor.

13. The pixel circuit of claim 10, wherein, in response to the display-scan operation being performed, each of the gate control signal, the compensation control signal, the bias control signal, and the emission control signal includes a turn-on voltage period.

14. The pixel circuit of claim 13, wherein the turn-on voltage period of the gate control signal, the turn-on voltage period of the compensation control signal, and the turn-on voltage period of the bias control signal are positioned in a turn-off voltage period of the emission control signal.

15. The pixel circuit of claim 14, wherein the turn-on voltage period of the bias control signal and the turn-on voltage period of the gate control signal are sequentially positioned in the turn-on voltage period of the compensation control signal.

16. The pixel circuit of claim 10, wherein, in response to the self-scan operation being performed, each of the bias control signal and the emission control signal includes a turn-on voltage period, and each of the gate control signal and the compensation control signal does not include the turn-on voltage period.

17. The pixel circuit of claim 16, wherein the turn-on voltage period of the bias control signal is positioned in a turn-off voltage period of the emission control signal.

18. A display device comprising:
a display panel including a pixel circuit configured to perform an initializing operation, which is an operation that initializes a gate terminal of a driving transistor, without receiving an initialization control signal;
first and second gate drivers configured to apply a gate control signal to the pixel circuit via gate lines extending in a first direction and located at opposite sides of the display panel in the first direction;

first and second compensation drivers configured to apply a compensation control signal to the pixel circuit via compensation lines extending in the first direction and located at opposite sides of the display panel in the first direction;

a bias driver configured to apply a bias control signal to the pixel circuit via bias lines extending in the first direction and located at one side of the display panel in the first direction;

an emission driver configured to apply an emission control signal to the pixel circuit via emission lines extending in the first direction and located at one side of the display panel in the first direction;

a data driver configured to apply a data signal to the pixel circuit via data lines extending in a second direction crossing the first direction;

a timing controller configured to control the first and second gate drivers, the first and second compensation drivers, the bias driver, the emission driver, and the data driver; and a light emitting element including a first terminal connected to a fourth node and a second terminal configured to receive a second power voltage lower than the first power voltage, wherein the pixel circuit is configured to perform one display-scan operation in response to a driving time of a panel driving frame being a minimum driving time and to perform one display-scan operation and at least one self-scan operation in response to the driving time of the panel driving frame not being the minimum driving time.

19. The display device of claim 18, wherein the pixel circuit includes:

a first transistor including a first terminal connected to a first node, a gate terminal connected to a second node, and a second terminal connected to a third node, the first transistor being the driving transistor;

a second transistor including a first terminal configured to receive the data signal, a second terminal connected to the first node, and a gate terminal configured to receive the gate control signal;

a third transistor including a first terminal connected to the third node, a second terminal connected to the second node, and a gate terminal configured to receive the compensation control signal;

a fourth transistor including a first terminal connected to the third node, a second terminal configured to receive a first initialization voltage, and a gate terminal configured to receive a previous gate control signal that is applied before the gate control signal;

a fifth transistor including a first terminal configured to receive a first power voltage, a second terminal connected to the first node, and a gate terminal configured to receive the emission control signal;

a sixth transistor including a first terminal connected to the third node, a second terminal connected to a fourth node, and a gate terminal configured to receive the emission control signal;

a seventh transistor including a first terminal connected to the fourth node, a second terminal configured to receive a second initialization voltage, and a gate terminal configured to receive the bias control signal;

an eighth transistor including a first terminal connected to the first node, a second terminal configured to receive a bias voltage, and a gate terminal configured to receive the bias control signal; and a storage capacitor including a first terminal configured to receive the first power voltage and a second terminal connected to the second node.

20. The display device of claim 18, wherein the pixel circuit includes:

a first transistor including a first terminal connected to a first node, a gate terminal connected to a second node, and a second terminal connected to a third node, the first transistor being the driving transistor;

a second transistor including a first terminal configured to receive the data signal, a second terminal connected to the first node, and a gate terminal configured to receive the gate control signal;

a third transistor including a first terminal connected to the third node, a second terminal connected to the second node, and a gate terminal configured to receive the compensation control signal;

a fourth transistor including a first terminal connected to the third node, a second terminal configured to receive a first initialization voltage, and a gate terminal configured to receive the bias control signal;

a fifth transistor including a first terminal configured to receive a first power voltage, a second terminal connected to the first node, and a gate terminal configured to receive the emission control signal;

a sixth transistor including a first terminal connected to the third node, a second terminal connected to a fourth node, and a gate terminal configured to receive the emission control signal;

a seventh transistor including a first terminal connected to the fourth node, a second terminal configured to receive a second initialization voltage, and a gate terminal configured to receive the bias control signal;

an eighth transistor including a first terminal connected to the first node, a second terminal configured to receive a bias voltage, and a gate terminal configured to receive the bias control signal; and a storage capacitor including a first terminal configured to receive the first power voltage and a second terminal connected to the second node.

* * * * *